(12) United States Patent
Radosavljevic et al.

(10) Patent No.: US 12,125,888 B2
(45) Date of Patent: Oct. 22, 2024

(54) GROUP III-NITRIDE (III-N) DEVICES WITH REDUCED CONTACT RESISTANCE AND THEIR METHODS OF FABRICATION

(71) Applicant: INTEL CORPORATION, Santa Clara, CA (US)

(72) Inventors: Marko Radosavljevic, Portland, OR (US); Han Wui Then, Portland, OR (US); Sansaptak Dasgupta, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 884 days.

(21) Appl. No.: 16/642,861

(22) PCT Filed: Sep. 29, 2017

(86) PCT No.: PCT/US2017/054471
§ 371 (c)(1),
(2) Date: Feb. 27, 2020

(87) PCT Pub. No.: WO2019/066935
PCT Pub. Date: Apr. 4, 2019

(65) Prior Publication Data
US 2021/0367047 A1    Nov. 25, 2021

(51) Int. Cl.
*H01L 29/778* (2006.01)
*H01L 21/02* (2006.01)
(Continued)

(52) U.S. Cl.
CPC .... *H01L 29/41725* (2013.01); *H01L 21/0254* (2013.01); *H01L 29/0847* (2013.01); *H01L 29/2003* (2013.01); *H01L 29/205* (2013.01); *H01L 29/66462* (2013.01); *H01L 29/7786* (2013.01); *H01L 29/7787* (2013.01)

(58) Field of Classification Search
None
See application file for complete search history.

(56) References Cited

U.S. PATENT DOCUMENTS

| 4,961,194 A | 10/1990 | Kuroda et al. |
| 5,367,183 A | 11/1994 | Perea et al. |
| (Continued) | | |

FOREIGN PATENT DOCUMENTS

| CN | 1279733 | 1/2001 |
| CN | 1409868 | 4/2003 |
| (Continued) | | |

OTHER PUBLICATIONS

Brown, D. "Self-Aligned AlGaN/GaN FinFETs" IEEE Elec. Dev. Lett. vol. 38, No. 10 published Aug. 31, 2017 pp. 1445-1448 (Year: 2017).*

(Continued)

*Primary Examiner* — Grant S Withers
(74) *Attorney, Agent, or Firm* — Essential Patents Group, LLP

(57) ABSTRACT

A device including a III-N material is described. In an example, the device has terminal structure having a first group III-Nitride (III-N) material. The terminal structure has a central body and a first plurality of fins, and a second plurality of fins, opposite the first plurality of fins. A polarization charge inducing layer is above a first portion of the central body. A gate electrode is above the polarization charge inducing layer. The device further includes a source structure and a drain structure, each including impurity dopants, on opposite sides of the gate electrode and on the plurality of fins, and a source contact on the source structure and a drain contact on the drain structure.

20 Claims, 16 Drawing Sheets

(51) Int. Cl.
  *H01L 29/08* (2006.01)
  *H01L 29/20* (2006.01)
  *H01L 29/205* (2006.01)
  *H01L 29/417* (2006.01)
  *H01L 29/66* (2006.01)

(56) References Cited

U.S. PATENT DOCUMENTS

| | | | |
|---|---|---|---|
| 6,045,626 A | 4/2000 | Yano et al. | |
| 6,121,153 A | 9/2000 | Kikkawa | |
| 6,225,196 B1 | 5/2001 | Yokoyama | |
| 6,261,929 B1 | 7/2001 | Gehrke et al. | |
| 6,325,850 B1 | 12/2001 | Beaumont et al. | |
| 6,521,514 B1 | 2/2003 | Gehrke et al. | |
| 6,608,327 B1 | 8/2003 | Davis et al. | |
| 6,617,668 B1 | 9/2003 | Koide et al. | |
| 7,501,669 B2 | 3/2009 | Parikh et al. | |
| 7,952,150 B1 | 5/2011 | Wohlmuth | |
| 8,173,551 B2 | 5/2012 | Bai et al. | |
| 8,313,967 B1 | 11/2012 | Lee et al. | |
| 8,383,471 B1 | 2/2013 | Shinihara et al. | |
| 8,507,304 B2 | 8/2013 | Kryliouk et al. | |
| 8,519,438 B2 | 8/2013 | Mishra et al. | |
| 8,530,978 B1 | 9/2013 | Chu et al. | |
| 8,569,769 B2 | 10/2013 | Hwang et al. | |
| 8,629,477 B2 | 1/2014 | Lochtefeld et al. | |
| 8,772,786 B2 | 7/2014 | Tabatabaie et al. | |
| 8,836,016 B2 | 9/2014 | Wu et al. | |
| 9,000,485 B2 | 4/2015 | Lee et al. | |
| 9,117,777 B2 | 8/2015 | Vincent et al. | |
| 9,153,583 B2 | 10/2015 | Glass et al. | |
| 9,196,709 B2 | 11/2015 | Lee et al. | |
| 9,240,410 B2 | 1/2016 | Then et al. | |
| 9,722,053 B1* | 8/2017 | Sung | H01L 29/161 |
| 10,056,456 B2 | 8/2018 | Then et al. | |
| 10,229,991 B2 | 3/2019 | Dasgupta et al. | |
| 10,325,774 B2 | 6/2019 | Dasgupta et al. | |
| 11,233,053 B2 | 1/2022 | Radosavljevic et al. | |
| 2001/0040246 A1 | 11/2001 | Ishii | |
| 2002/0110989 A1 | 8/2002 | Yamaguchi et al. | |
| 2002/0152952 A1 | 10/2002 | Beaumont | |
| 2003/0045017 A1 | 3/2003 | Hiramatsu et al. | |
| 2004/0029365 A1 | 2/2004 | Linthicum et al. | |
| 2004/0169192 A1 | 9/2004 | Kato et al. | |
| 2006/0084245 A1 | 4/2006 | Khoda | |
| 2006/0124962 A1 | 6/2006 | Ueda et al. | |
| 2006/0181828 A1 | 8/2006 | Sato | |
| 2006/0197129 A1 | 9/2006 | Wohlmuth | |
| 2007/0045670 A1 | 3/2007 | Kuraguchi | |
| 2007/0158692 A1* | 7/2007 | Nakayama | H01L 29/7787 257/E29.255 |
| 2007/0278507 A1 | 12/2007 | Nakazawa et al. | |
| 2008/0036038 A1 | 2/2008 | Hersee et al. | |
| 2008/0070355 A1 | 3/2008 | Lochtefeld et al. | |
| 2008/0093622 A1 | 4/2008 | Li | |
| 2008/0099785 A1 | 5/2008 | Bai | |
| 2008/0127884 A1 | 6/2008 | Tischler et al. | |
| 2008/0197358 A1 | 8/2008 | Frahm et al. | |
| 2008/0211583 A1 | 9/2008 | Nguyen et al. | |
| 2008/0315256 A1* | 12/2008 | Ohta | H01L 29/66462 257/E29.253 |
| 2009/0039361 A1 | 2/2009 | Li | |
| 2009/0267078 A1 | 10/2009 | Mishra et al. | |
| 2010/0012976 A1 | 1/2010 | Hydrick et al. | |
| 2010/0012977 A1 | 1/2010 | Derluyn et al. | |
| 2010/0028809 A1* | 2/2010 | Vanleenhove | G03F 7/11 430/312 |
| 2010/0068866 A1 | 3/2010 | Yu et al. | |
| 2010/0072576 A1 | 3/2010 | Arena | |
| 2010/0140735 A1 | 6/2010 | Bommena et al. | |
| 2010/0207138 A1 | 8/2010 | Nakahata et al. | |
| 2010/0213511 A1 | 8/2010 | Lochtefeld | |
| 2010/0219452 A1 | 9/2010 | Brierley | |
| 2010/0270559 A1 | 10/2010 | Ota | |
| 2011/0037098 A1 | 2/2011 | Kim et al. | |
| 2011/0079822 A1 | 4/2011 | Kanamura | |
| 2011/0117726 A1 | 5/2011 | Pinnington et al. | |
| 2011/0210377 A1 | 9/2011 | Haeberlen et al. | |
| 2011/0272740 A1 | 11/2011 | Umeda et al. | |
| 2011/0278945 A1 | 11/2011 | Wheatley, III et al. | |
| 2011/0284865 A1 | 11/2011 | Inoue et al. | |
| 2012/0119218 A1 | 5/2012 | Su et al. | |
| 2012/0119220 A1 | 5/2012 | Guo et al. | |
| 2012/0248500 A1 | 10/2012 | Kajitana | |
| 2012/0292789 A1 | 11/2012 | Sazawa | |
| 2012/0305992 A1 | 12/2012 | Marino et al. | |
| 2013/0015460 A1 | 1/2013 | Chen et al. | |
| 2013/0015525 A1 | 1/2013 | Cheng | |
| 2013/0043468 A1 | 2/2013 | Adekore | |
| 2013/0043485 A1 | 2/2013 | Ueno | |
| 2013/0049013 A1 | 2/2013 | Shimada | |
| 2013/0105808 A1 | 5/2013 | Wong et al. | |
| 2013/0105810 A1 | 5/2013 | Nishimori et al. | |
| 2013/0146893 A1 | 6/2013 | Thei et al. | |
| 2013/0221409 A1 | 8/2013 | Nakajima et al. | |
| 2013/0228809 A1 | 9/2013 | Chang et al. | |
| 2013/0256679 A1 | 10/2013 | Yao et al. | |
| 2013/0270579 A1 | 10/2013 | Yu et al. | |
| 2013/0271208 A1 | 10/2013 | Then et al. | |
| 2013/0277686 A1 | 10/2013 | Liu et al. | |
| 2013/0307513 A1 | 11/2013 | Then et al. | |
| 2013/0313561 A1 | 11/2013 | Suh | |
| 2013/0320353 A1 | 12/2013 | Kryiouk et al. | |
| 2013/0334538 A1 | 12/2013 | Saunier | |
| 2014/0014966 A1 | 1/2014 | Tabatabaie et al. | |
| 2014/0042446 A1 | 2/2014 | Chiang | |
| 2014/0084300 A1 | 3/2014 | Okamoto | |
| 2014/0091308 A1 | 4/2014 | Dasgupta et al. | |
| 2014/0091310 A1 | 4/2014 | Jeon et al. | |
| 2014/0091398 A1 | 4/2014 | Hata et al. | |
| 2014/0091845 A1 | 4/2014 | Then et al. | |
| 2014/0094223 A1 | 4/2014 | Dasgupta et al. | |
| 2014/0110759 A1 | 4/2014 | Murata et al. | |
| 2014/0197459 A1 | 7/2014 | Kis et al. | |
| 2014/0203329 A1 | 7/2014 | Saitoh et al. | |
| 2014/0239312 A1 | 8/2014 | Shatalov et al. | |
| 2014/0252368 A1 | 9/2014 | Lee et al. | |
| 2014/0264321 A1 | 9/2014 | Liang | |
| 2014/0264379 A1 | 9/2014 | Kub et al. | |
| 2014/0264380 A1 | 9/2014 | Kub et al. | |
| 2015/0014820 A1 | 2/2015 | Renaud | |
| 2015/0041820 A1 | 2/2015 | Renaud | |
| 2015/0041860 A1 | 2/2015 | Nishimori et al. | |
| 2015/0061075 A1 | 3/2015 | Yeh | |
| 2015/0061078 A1 | 3/2015 | Abel et al. | |
| 2015/0083206 A1 | 3/2015 | Novoselov et al. | |
| 2015/0103977 A1 | 4/2015 | Ono et al. | |
| 2015/0115325 A1 | 4/2015 | Vielemeyer | |
| 2015/0144957 A1 | 5/2015 | Lu et al. | |
| 2015/0200287 A1* | 7/2015 | Beam, III | H01L 29/205 257/194 |
| 2015/0206796 A1 | 7/2015 | Dasgupta et al. | |
| 2015/0263223 A1 | 9/2015 | Ito | |
| 2015/0318276 A1 | 11/2015 | Bayram et al. | |
| 2015/0340482 A1 | 11/2015 | Padmanabhan et al. | |
| 2015/0364592 A1 | 12/2015 | van Dal et al. | |
| 2016/0111496 A1 | 4/2016 | Leobandung | |
| 2016/0204276 A1 | 7/2016 | Dasgupta et al. | |
| 2016/0336437 A1 | 11/2016 | Kajitani et al. | |
| 2016/0343805 A1 | 11/2016 | Lee et al. | |
| 2017/0003248 A1 | 1/2017 | Yang et al. | |
| 2017/0012117 A1 | 1/2017 | Radosavljevic et al. | |
| 2017/0059514 A1 | 3/2017 | Hoffman | |
| 2017/0278959 A1 | 9/2017 | Then et al. | |
| 2018/0175184 A1 | 6/2018 | Then et al. | |

FOREIGN PATENT DOCUMENTS

| | | |
|---|---|---|
| CN | 102017160 | 4/2011 |
| CN | 102306658 | 1/2012 |

(56) References Cited

FOREIGN PATENT DOCUMENTS

| | | |
|---|---|---|
| CN | 102576663 | 7/2012 |
| CN | 103582938 | 2/2014 |
| EP | 1054442 | 11/2000 |
| JP | S5851575 | 3/1983 |
| JP | S6240778 | 2/1987 |
| JP | 11243253 | 9/1999 |
| JP | 11260835 | 9/1999 |
| JP | 2001230410 | 8/2001 |
| JP | 2002249400 | 9/2002 |
| JP | 2007165431 | 6/2007 |
| JP | 2007317794 | 12/2007 |
| JP | 2008004720 | 1/2008 |
| JP | 2008162888 | 7/2008 |
| JP | 2008305816 | 12/2008 |
| JP | 2009054807 | 3/2009 |
| JP | 2011049521 | 3/2011 |
| JP | 2011159795 | 8/2011 |
| JP | 2011210751 | 10/2011 |
| JP | 2013128135 | 6/2013 |
| JP | 2014078653 | 5/2014 |
| JP | 2014131028 | 7/2014 |
| JP | 2014192167 | 7/2016 |
| KR | 20120048244 | 5/2012 |
| KR | 20130046249 | 5/2013 |
| KR | 1020140037702 | 3/2014 |
| KR | 101410092 | 6/2014 |
| TW | 201415626 | 4/2014 |
| WO | 2011064997 | 6/2011 |
| WO | 2015047355 | 4/2015 |
| WO | 2015147816 | 10/2015 |
| WO | 2016043748 | 3/2016 |
| WO | 2016048328 | 3/2016 |
| WO | 2016209263 | 12/2016 |

OTHER PUBLICATIONS

International Search Report and Written Opinion notified Jun. 28, 2018 for International Patent Application No. PCT/US2017/054471.

International Preliminary Report on Patentability from PCT/US2017/054471 notified Apr. 9, 2020, 12 pgs.

Guo, Jia et al., "MBE-Regrown Ohmics in InAlN HEMTs With a Regrowth Interface Resistance of 0.05Ω * mm", IEEE Electron Device Letters, vol. 33, No. 4, Apr. 2012, 3 pgs.

Gupta, P. et al., "Layered Transition Metal Dichalcogenides: Promising Near-Lattice-Matched Substrates for GaN Growth", Scientific Reports vol. 6, Article No. 23708 (2016); doi:10.1038/srep23708, Mar. 30, 2016, 23 pages.

Hahn, H et al., "First monolithic integration of GaN-based enhancement mode n-channel and p-channel heterostructure field effect transistors", 72nd Device Research Conference, Jun. 2014 (Jun. 2014), pp. 59-260, XP055155997, DOI: 10.1109/DRC.2014. 6872396 ISBN: 978-1-47-995405-6.

Katona, T.M. et al., "Control of crystallographic tilt in GaN grown on Si (111) by cantilever epitaxy", Applied Physics Letters, vol. 81, No. 19, Nov. 4, 2002, 3 pgs.

Masui, Hisashi et al., "Geometrical Characteristics and Surface Polarity of Inclined Crystallographic Plane of the Wurzite and Zincblende Structures", Journal of Electronic Materials, vol. 38, No. 6, 2009.

Takei, Y et al., "Ohmic Contact Properties Depending on AlGaN Layer Thickness for AlGaN/GaN High Electron Mobility Transistor Structures", ECS Transactions, vol. 61, No. 4, Mar. 20, 2014 (Mar. 20, 2014), pp. 265-270, XP055480356, US ISSN: 1938-6737, DOI: 10.1149/06104.0265ecst.

Wan, J. et al., "Growth of Crack-Free Hexagonal Gan Films on Si (100)", Applied Physics Letters, USA, Jul. 18, 2001, Vo. 79, No. 10. p. 1459-1460, DOI: 10.1063/1.1400770.

* cited by examiner

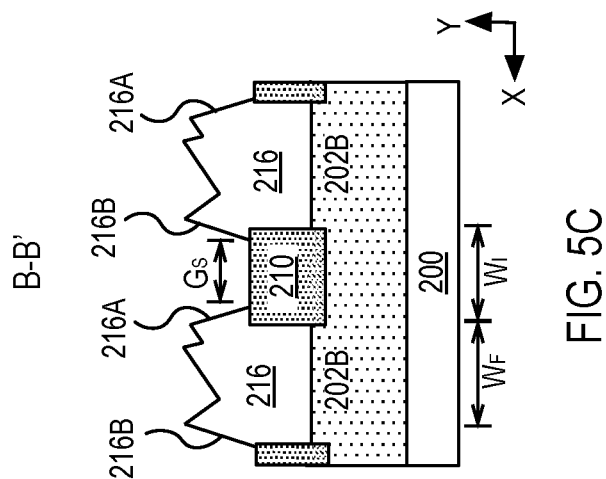
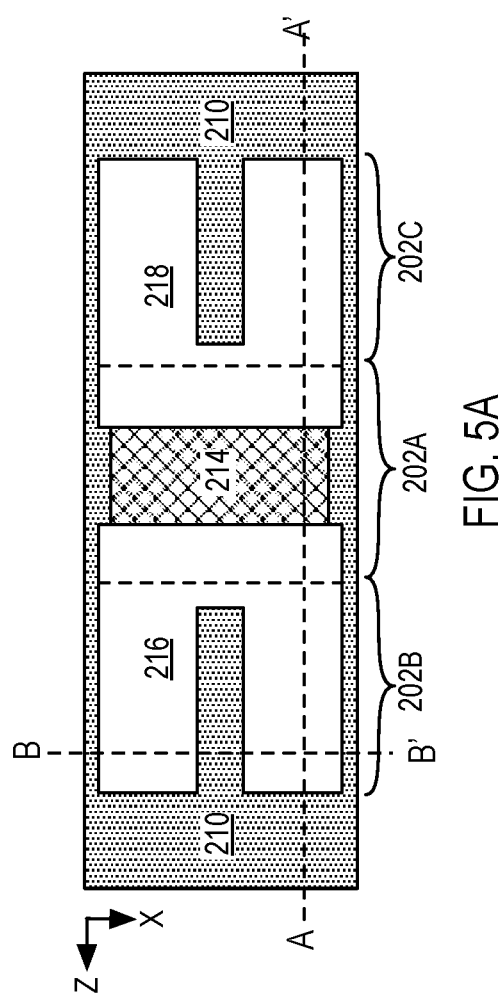
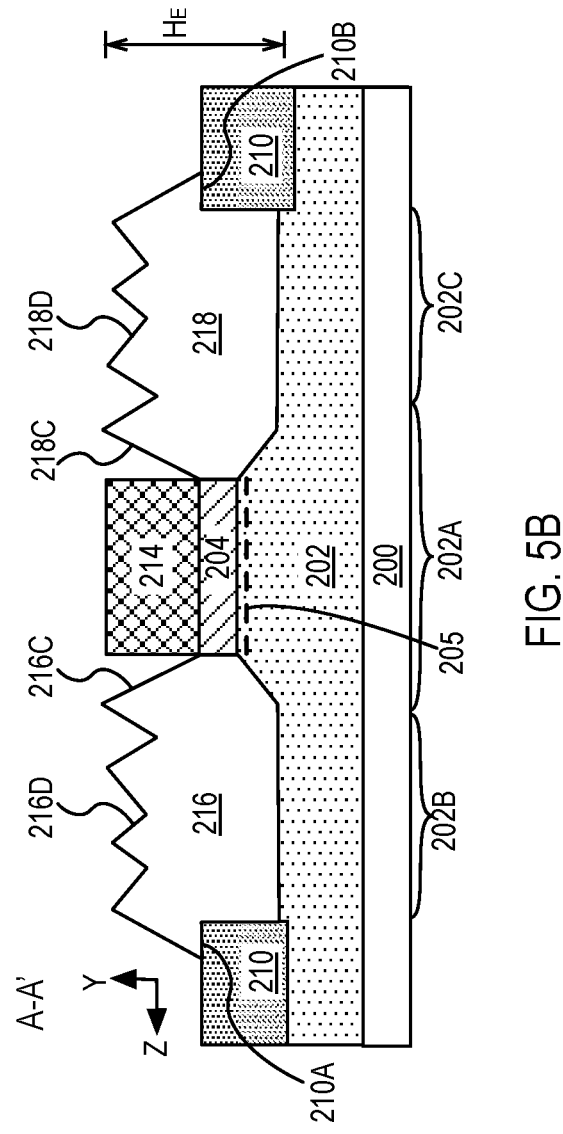
FIG. 5A
FIG. 5B
FIG. 5C

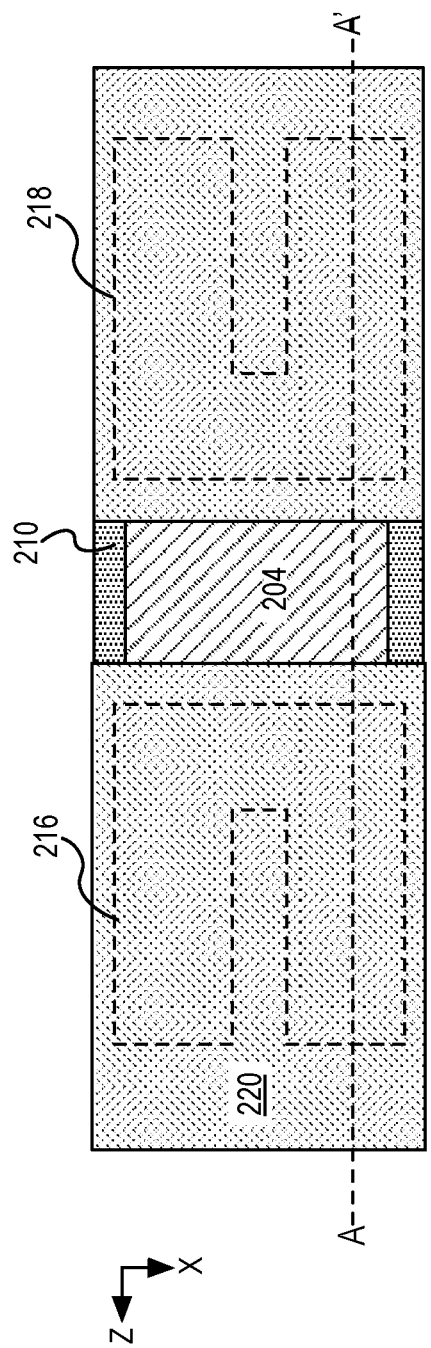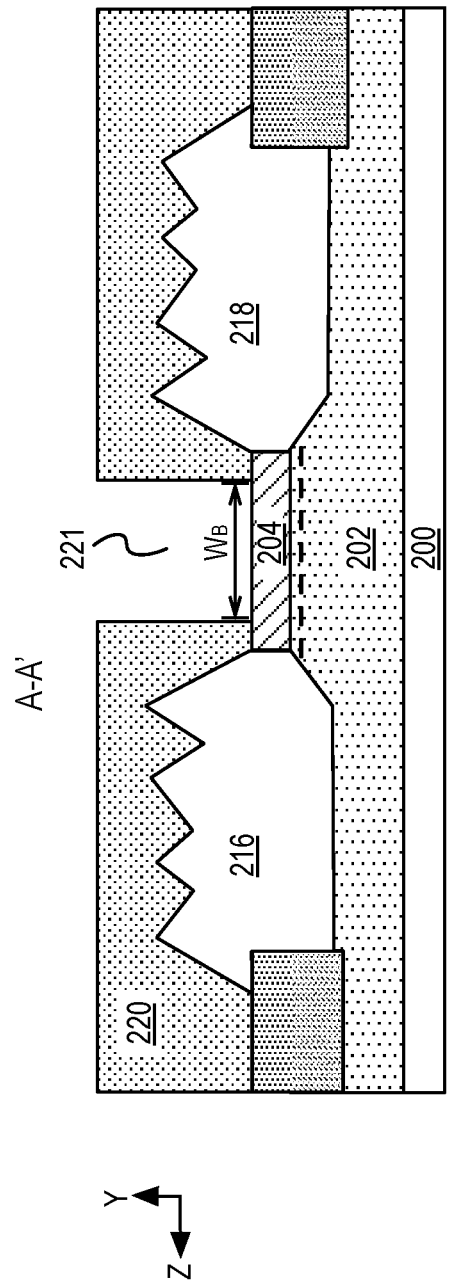

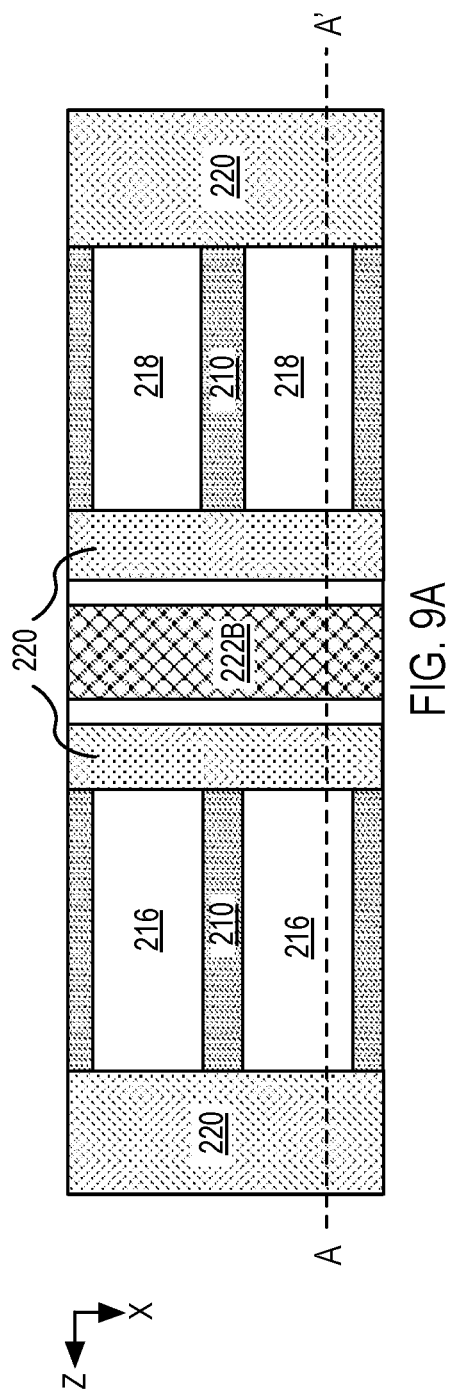
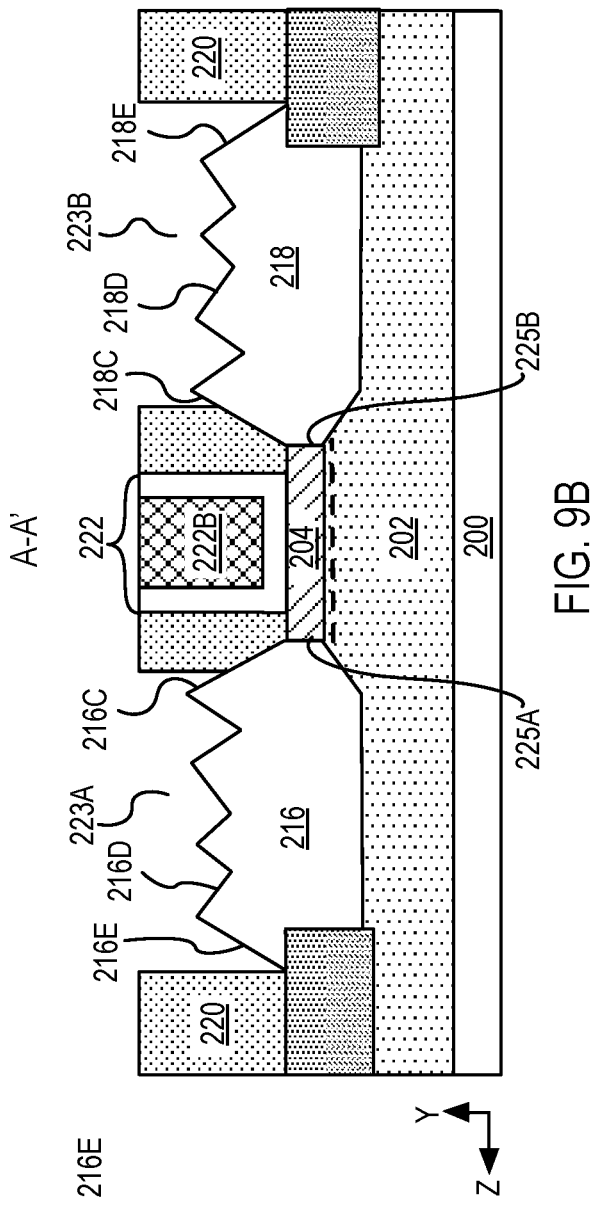
FIG. 9A
FIG. 9B

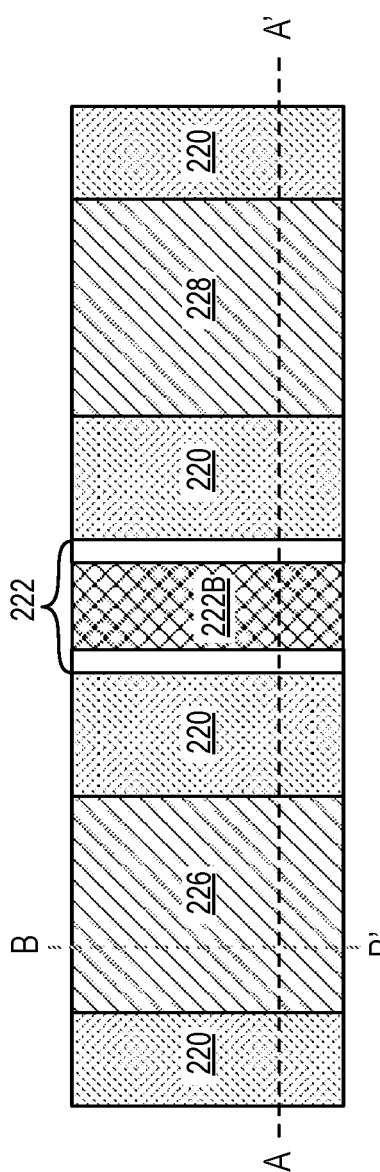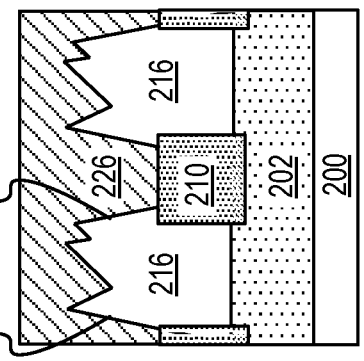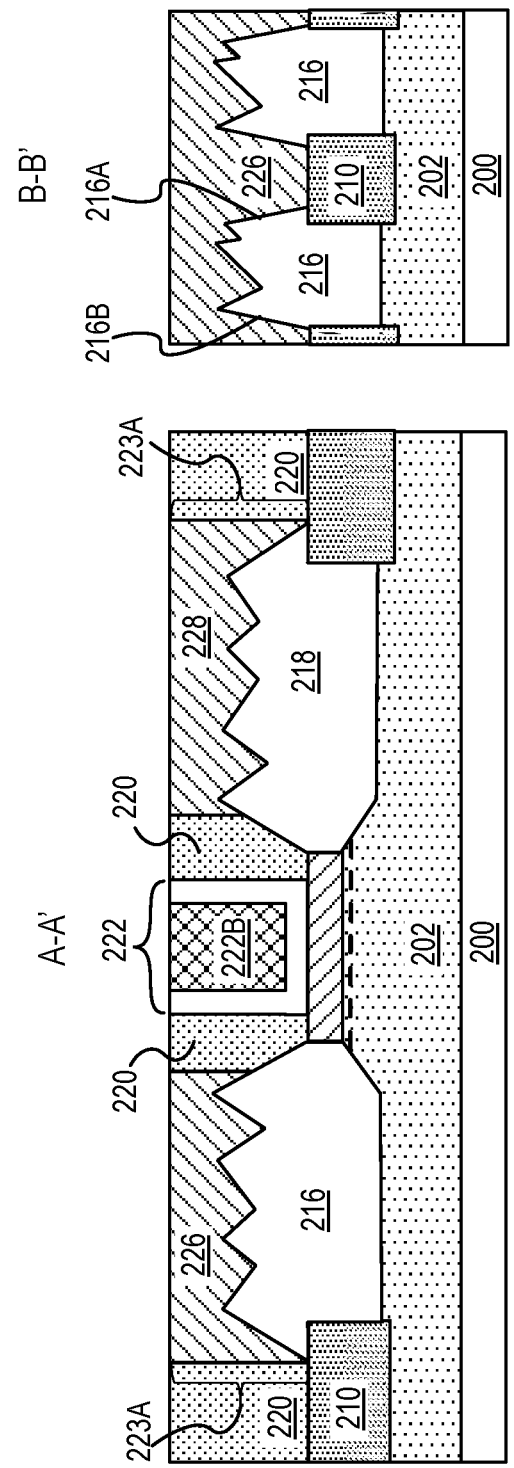

GROUP III-NITRIDE (III-N) DEVICES WITH REDUCED CONTACT RESISTANCE AND THEIR METHODS OF FABRICATION

CLAIM OF PRIORITY

This Application is a National Stage Entry of, and claims priority to, PCT Application No. PCT/US17/54471, filed on 29 Sep. 2017 and titled "GROUP III-NITRIDE (III-N) DEVICES WITH REDUCED CONTACT RESISTANCE AND THEIR METHODS OF FABRICATION", which is incorporated by reference in its entirety for all purposes.

BACKGROUND

In the fields of wireless communication and power management, various components can be implemented using solid-state devices. For example, in radio frequency (RF) communication, the RF front-end is a generic term for the circuitry between an antenna and a digital baseband system. Such RF front-end components may include one or more diodes in conjunction with one or more transistors, such as one or more field-effect transistors (FETs). Due, in part, to their large bandgap and high mobility, gallium nitride (GaN) and other group III-nitride (III-N) materials are suited for integrated circuits for applications such as high-frequency and high-power.

For many non-silicon materials, it can be challenging to provide doped semiconductor material suitable for making a good ohmic contact. Contact structures and techniques to reduce contact resistance and sheet resistance may advantageously reduce overall device resistance to enhance device performance and/or reduce device power consumption.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 5A illustrates a plan view of the structure of FIG. 4A following the formation of drain structures and source structures in the trenches.

FIG. 5B illustrates a cross-sectional view of the structure of FIG. 4B following the formation of drain structures and source structures in the trenches.

FIG. 5C illustrates a cross-sectional view of a source structure formed on a plurality of fins.

FIG. 7A illustrates a plan view of the structure of FIG. 6A following the formation of an opening in the dielectric layer over a portion of the polarization charge inducing layer.

FIG. 7B illustrates a cross-sectional view of the structure of FIG. 6B following the formation of an opening in the dielectric layer over a portion of the polarization charge inducing layer.

FIG. 9A illustrates a plan view of the structure of FIG. 8A following the formation of drain and source contact openings above the drain structures and source structures.

FIG. 9B illustrates a cross-sectional view of the structure of FIG. 8B following the formation of drain and source contact openings above the drain structures and source structures.

FIG. 10A illustrates a plan view of the structure of FIG. 9A following the formation of drain contact and source contact in the openings.

FIG. 10B illustrates cross-sectional views of the structure of FIG. 9Bfollowing the formation of drain contact and source contact in the openings.

FIG. 10C illustrates a cross-sectional view of a source contact formed on a source structure formed on a plurality of fins.

DESCRIPTION OF THE EMBODIMENTS

Figures 1A, 1B:
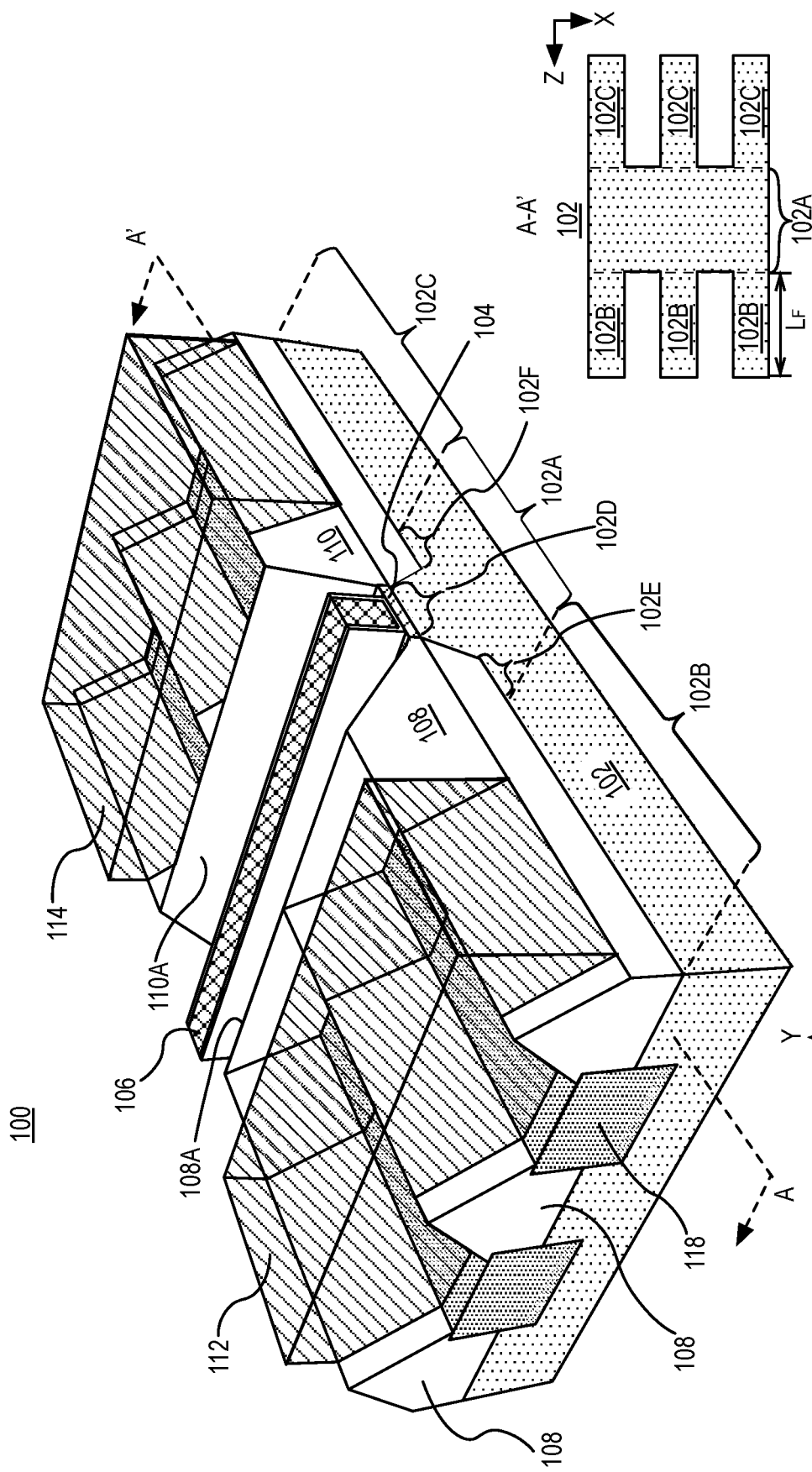
FIG. 1A illustrates an isometric view of a group III-N transistor having a source and drain structures with enhanced surface area, in accordance with embodiments of the present disclosure.
FIG. 1B illustrates a plan view of a terminal structure with a first and a second plurality of fins, in accordance with embodiments of the present disclosure.

Devices including III-N materials for logic, SoC and memory applications and their methods of fabrication are described. In the following description, numerous specific details are set forth, such as novel structural schemes and detailed fabrication methods in order to provide a thorough understanding of embodiments of the present disclosure. It will be apparent to one skilled in the art that embodiments of the present disclosure may be practiced without these specific details. In other instances, well-known features, such as enhancement mode operations associated with group III-N devices, are described in lesser detail in order to not unnecessarily obscure embodiments of the present disclosure. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous details are set forth. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

In the fields of wireless communication and power management, various components can be implemented using solid-state devices. For example, in radio frequency (RF) communication, the RF front-end is a generic term for the circuitry between an antenna and a digital baseband system. Such RF front-end components may include one or more transistors, such as one or more field-effect transistors (FETs). Due, in part, to their large bandgap and high mobility, gallium nitride (GaN) and other III-N materials are suited for integrated circuits for applications such as high-frequency and high-power. However, optimizing power efficiency of RF-front end components and minimizing energy loss during operation is highly desirable. Devices such as transistors fashioned from III-N materials, may be susceptible to energy loss from various sources such as from conduction and switching losses. The latter is affected by the transition between "on" and "off" states during device operation. In particular, transitioning between on and off states of the transistor may be affected by resistances within the device. Device resistances include internal resistances associated carrier mobility within the channel material, and external resistances between the channel material and external contacts associate with source and drain resistances and metal-semiconductor junction resistances. III-N channels generally have high carrier mobility, but to fully capitalized on this attribute, external resistance should be minimized. Thus, pathways to minimize contact resistance are especially attractive for practical realization of devices based on III-N materials.

In an embodiment of the present disclosure, a device, such as a transistor including a III-N material, has a central body and a first plurality of fins adjacent to a first side of the central body, and a second plurality of fins adjacent to a second side of the central body. A gate is disposed above the III-N material. The device further includes a source structure and a drain structure each having an impurity dopant on opposite sides of the gate electrode. In an embodiment, the source structure is epitaxially grown above the first plurality of fins, and the drain structure is epitaxially grown above the second plurality of fins. A source contact is disposed on the source structure and a drain contact is disposed on the drain structure. The inventors have discovered that when the epitaxially grown source and drain structures are formed on fins that are fashioned from a III-N material, the 3D nature of epi growth, is more pronounced leading to a larger effective surface area than that obtained from a single continuous source or a drain structure spanning a same foot print as the fin structure. The source and drain contacts, consequently have a larger area to contact the epitaxially grown 3D source and drain structures, respectively. An effective increase in contact area between the source contact and the source structure and between the drain contact and the drain structure can reduce the contact resistance of the transistor by as much as 70%. By reducing the contact resistance of the transistor, the external resistance of a III-N transistor may be reduced.

FIG. 1A illustrates an isometric view of a device 100, such as a group III-N transistor, having a terminal structure 102 that includes a first III-N material, in an accordance with an embodiment of the present disclosure. FIG. 1B illustrates a plan view layout of the terminal structure 102 along a line A-A' of the isometric view in FIG. 1A. In one embodiment, the terminal structure 102 has a central body 102A, a first plurality of fins including individual fins 102B and a second plurality of fins including individual fins 102C. In the illustrated embodiment, three fins are shown, but there can be any number of such fins (e.g., ranging from two to thousands). The fins have a length, $L_F$, that is between 500 nm to 1000 nm.

Referring again to the isometric view in FIG. 1A, a polarization charge inducing layer 104 is disposed above an uppermost surface of a central body portion 102D. In an embodiment, the polarization charge inducing layer 104 includes a second III-N material. The device 100 further includes a gate 106 above the polarization charge inducing layer 104. A source structure 108 and a drain structure 110, each including a third III-N material with an impurity dopant, are disposed on opposite sides of the gate 106. The source structure 108 is above a central body portion 102E and above the fins 102B. The drain structure 110 is disposed above a third portion 102F of the central body 102A and above the fins 102C. As an example, the third portion 102F of the central body 102A, similarly, has a relatively flat lower surface and a sloped sidewall opposite to the sidewall 105 as illustrated in FIG. 1A. The device 100 further includes a source contact 112 on the source structure 108, and a drain contact 114 on the drain structure 110. The region between each of the fins 102B, and between each of the fins 102C is occupied by a spacer 118.

Figure 1D:
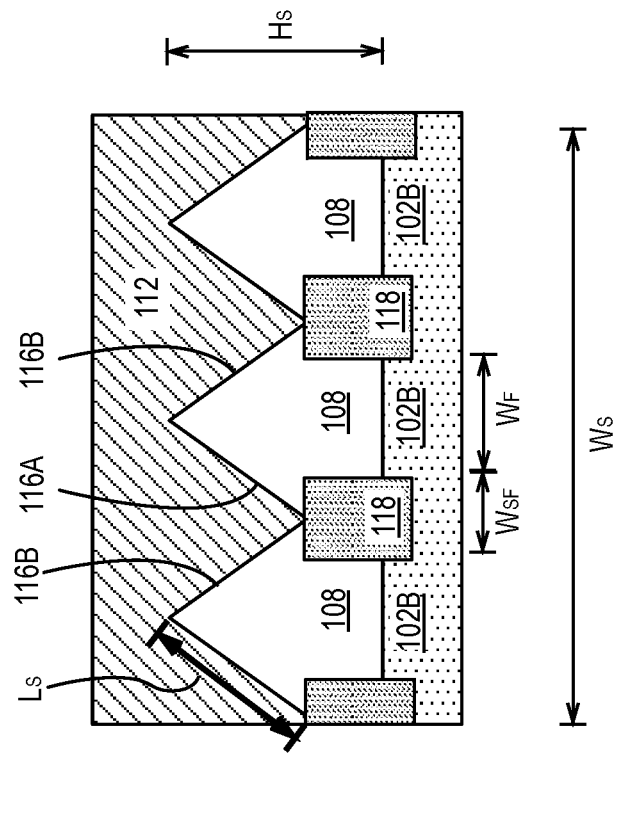
FIG. 1D illustrates a cross-sectional view of a contact structure in contact with a source structure having sidewalls that intersect over a spacer separating portions of the source structure, in an accordance with an embodiment of the present disclosure
Figure 1C:
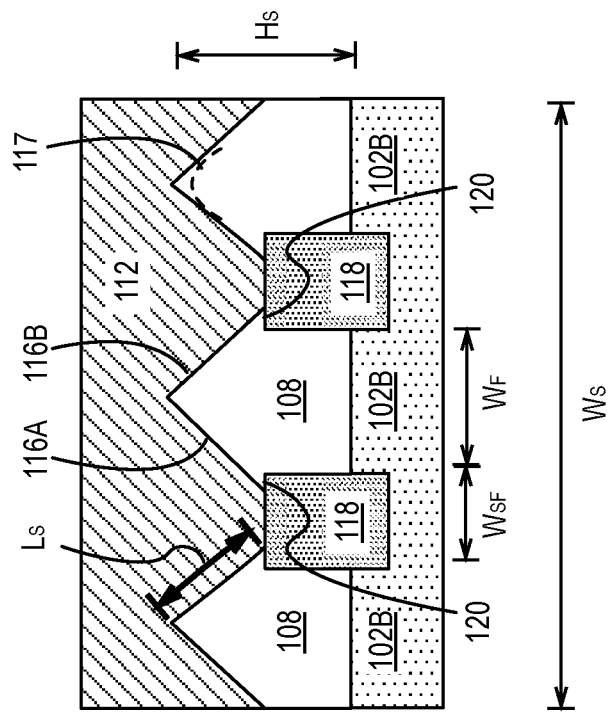
FIG. 1C illustrates a cross-sectional view of a contact structure in contact with a source structure having sidewalls that intersect at an apex, in an accordance with an embodiment of the present disclosure.

Referring to FIG. 1C, in an embodiment, each source structure 108 above each fin 102A has a pair of sidewalls 116A and 116B that are sloped. In the illustrated embodiment, the sidewalls 116A and 116B extend onto portions 120 of the spacer 118. In other embodiments, the sidewalls 116A and 116B do not extend onto the spacer 118. In another example, the sidewall 116A from one source structure 108 can meet an adjacent sidewall 116B from another source structure 108, but not overlap. When adjacent sidewalls overlap, the contact area from a 3D source structure may diminish.

The slope of each of the sidewalls 116A or 116B depends on the material of the source structure 108. In one example, each sidewall 116A and 116B has an angle that is approximately 60 degrees with respect to an uppermost surface of the fin 102B. In one such example, the sidewalls 116A and 116B intersect at an apex as is depicted in FIG. 1C. Furthermore, in the illustrated embodiment, the sidewalls 116A and 116B intersect at an apex, but the sidewall 116A of one source structure 108 does not intersect with a neighboring sidewall 116B from a neighboring source structure 108. In other embodiments, an upper portion of the source structure 108 can have curvature indicated by dashed lines 117.

In the embodiment illustrated in FIG. 1C, the source contact 112 has an area of contact with the source structure 108, where the area of contact has a first dimension, in the X-Y plane and a second dimension along the Z direction (into the page). In an embodiment, the first dimension of the area of contact has a magnitude that is given by the sum of a length, $L_{S, of}$ each of the $_{Sloped}$ sidewalls 116A and 116B of the source structure 108. In an embodiment, the sum of the length $L_{S of}$ all of the sidewalls 116A and 116B is greater than a combined width, $W_S$, where $W_S$, is approximately equal to the sum of the width, $W_F$, of each of the fins 102B and the sum of the individual width, $W_S$, of the spacer 118 between each of the fins 102B, i.e.

$$\Sigma L_S > W_S \qquad (1)$$

$$W_S = \Sigma W_F + \Sigma W_{SP} \qquad (2)$$

It is to be appreciated that in the illustrated embodiment, the relative magnitude of the $W_F$ and $W_{SP}$ will determine if the source structure 108 can actually provide a contact area advantage. In one example, where sidewalls 116A and 116B are sloped at approximately 60 degrees, and the width, $W_{SP}$, of each spacer 118 is equal to or less than the width, $W_F$, of the fin 102B, relationship (1) is satisfied. In other embodiments, when sidewalls 116A and 116B are sloped at 60 degrees relative to an uppermost surface of the fin 102B, the width, $W_{SP}$, of each spacer 118 can be up to two times the width, $W_F$, of each fin 102B for relation (1) to be satisfied. In yet another embodiment, when the sidewalls 116A and 116B are sloped at an angle that is less than 60 degrees but greater than 30 degrees, the width, $W_{SP}$, of each spacer 118 can be equal to or less than the width, $W_F$, of each fin 102B to obtain a contact area advantage.

In an embodiment, each fin 102B has a width, $W_F$, between 100 nm-500 nm and the source structure 108 has a height, $H_S$, between 80 nm-430 nm, and each of the spacers 118 has a width between 50 nm-100 nm. In, one such embodiment, the length, $L_S$, of sidewall 116A and 116B is between 100 nm-500 nm.

In an example, the sidewall 116A from one source structure 108 can meet a neighboring sidewall 116B from neighboring source structure 108 on the spacer 118, as is depicted in the cross-sectional illustration of FIG. 1D. In one such example, the length, $L_S$ of the sidewall 116A and 116B of the source structure 108 in FIG. 1D is greater compared to the length, $L_S$ of the sidewall 116A and 116B of the source structure 108 depicted in FIG. 1C. A source structure depicted in FIG. 1D can offer a greater contact area for the source contact 116 as compared to the contact area from the source contact 116 depicted in FIG. 1C.

It is to be appreciated that an increased contact area from a 3D source structure may provide diminishing returns when a sidewall 116A from one source structure 108 depicted in FIG. 1D, merges further with a neighboring sidewall 116B from neighboring source structure 108. While the combined length, $L_S$, of each sidewall 116A and 116B of a source structure 108 having multiple merged sidewalls may be increased, other factors such as increased intrinsic resistance of the source structure 108 may outweigh, benefits obtained from a surface area increase.

Referring again to FIG. 1A, the source contact 112 has a second dimension (in a plane that is into the page) that is approximately equal to a length of the fin 102B. To further increase the area of contact between the source contact 112 and the source structure 108, the source contact 112 can extend over the entire source structure 108. In one such example, the source contact 112 is also in contact with a source structure sidewall 108A, adjacent to the gate 106. Similarly, in the illustrative embodiment, the drain contact 114 extends along a portion of the fin 102C. To further increase a contact area between the drain contact 114 and the drain structure 110, the drain contact 114 can extend over the entire drain structure 110. In one such example, the drain contact 114 is also in contact with a drain structure sidewall 110A.

In one or more embodiments, the drain structure 110 has one or more or all of the features of the source structure 108 and the drain contact 114 has one or more or all of the features of the source contact 112 described above in the various embodiments.

Figure 1E:
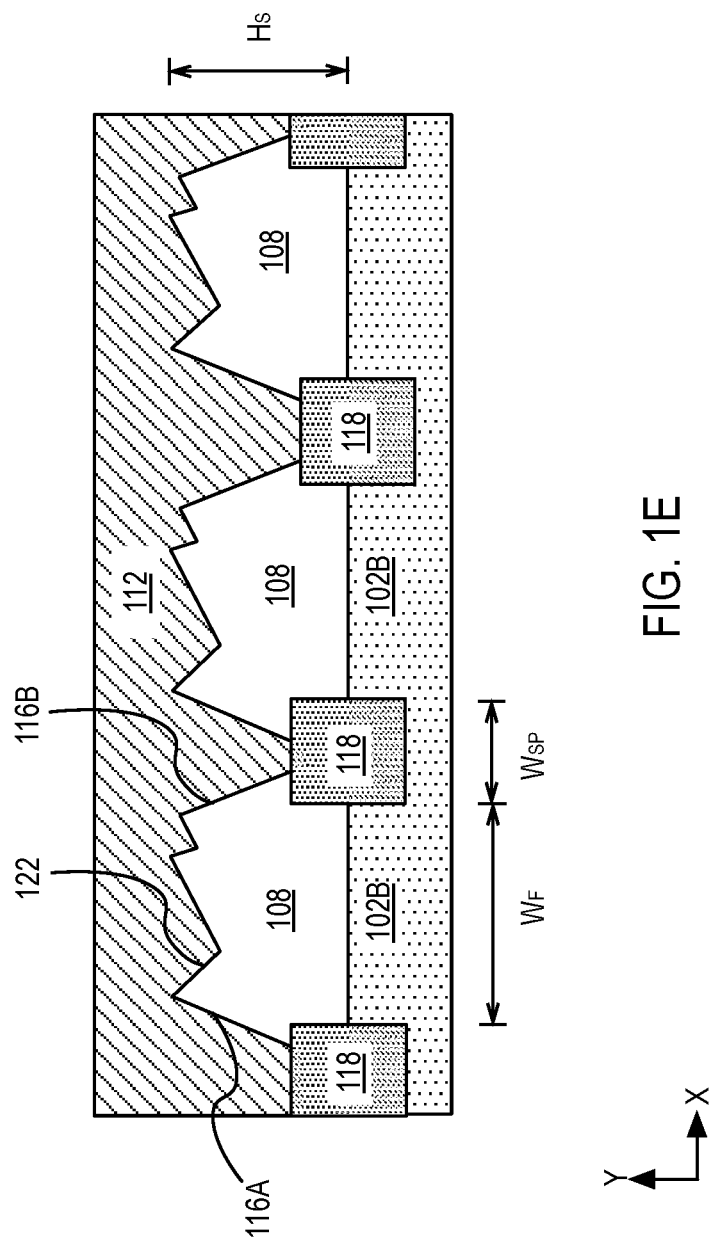
FIG. 1E illustrates a cross-sectional view of a contact structure in contact with a source structure having an upper surface area with corrugation, in an accordance with an embodiment of the present disclosure.

An embodiment where the sidewalls 116A or 116B of the source structure 108 do not intersect at an apex is illustrated in FIG. 1E. The source structure 108, in such an example, is characterized by an uppermost surface 122 that is corrugated, where the corrugation is between 10 nm-50 nm. Corrugation of the uppermost surface 122 may result in a larger surface area for source contact 112 compared to an uppermost surface that is not corrugated. In one such example, the fin 102B has a width, $W_F$, that is at least 100 nm and the height, $H_S$, of the source structure 108 is between 50 nm-70 nm and the sidewalls 116A and 116B have a slope of approximately 60 degrees (relative to lowermost surface of the source structure 108).

In an embodiment, the first III-N material includes a gallium nitride (GaN). In one such embodiment, the first III-N material has a relatively high carrier mobility, (greater than 500 cm$^2$ V$^{-1}$). The first III-N material may be a substantially un-doped III-N material (i.e., O$_2$ impurity concentration minimized) for minimal impurity scattering. In other embodiments, the first III-N material includes one or more ternary alloys of GaN, such as AlGaN, AlInN, or a quaternary alloy of GaN including at least one group III element and nitrogen, such as In$_x$Al$_y$Ga$_{1-x-y}$N, where x ranges from 0.01-0.1 and y ranges from 0.01-0.1. Depending on applications, the first III-N material has a material thickness approximately in the range of 100 nm-5 um.

In an embodiment, the source structure 108 and drain structure 110, have uppermost surfaces that are above the level of the polarization charge inducing layer 104 and the spacer 118. In an embodiment, the source structure 108, drain structure 110 include a third III-N material that is lattice matched to the first III-N material of the terminal structure 102. In one exemplary embodiment where the terminal structure 102 includes a material such as GaN the source structure 108, drain structure 110 includes a single crystal of InGaN. In the illustrative embodiment, the source structure 108 and the drain structure 110 include faceted crystals having sidewalls, such as sidewalls 116A and 116B, that are approximately 60 degrees with respect to an uppermost surface of the first or the second plurality of fins.

In an exemplary embodiment, the third III-N material includes an impurity dopant such as an n-type dopant or an n+ dopant. Examples of an n-type dopant includes a material such as Si or Ge. In one embodiment, the n-type dopant material is silicon. As a further example, the silicon n-type dopant may have a n-dopant density of at least 1e19/cm$^3$. Doping of the source structure 108 can reduce the bandgap between the source contact 112 and the source structure 108. Likewise, doping of the drain structure 110 can reduce the bandgap between drain contact 114 and the drain structure 110. A reduced bandgap may lead to a reduced contact resistance of the device 100. In an embodiment, a combination of the height and length of the source structure 108 and drain structure 110, the n-type dopant density, and 3D faceted sidewalls help to achieve a specific contact resistance value that is less than 200 ohms. In an embodiment, the source structure 108 and the drain structure 110 each includes a third III-N material having an indium content that increases from 1% to 10%, where the higher indium content is proximate to the source contact 112 and drain contact 114, respectively. A higher indium content at an interface between the source structure 108 and the source contact 112 and between the drain structure 110 and the drain contact 114 may reduce the bandgap even further.

In an embodiment, the source contact 112, and the drain contact 114 each include a multi-layer stack. In an embodiment, the multi-layer stack includes two or more distinct layers of metal such as a layer of Ti, Ru or Al and a conductive cap on the layer of metal. The conductive cap may include a material such as W or Cu.

Examples of the spacer 118 may include any material that is sufficiently strong to provide electrical isolation such as, but not to, limited silicon dioxide, silicon nitride, silicon oxynitride, carbon doped nitride and carbon doped oxide.

Figure 1F:
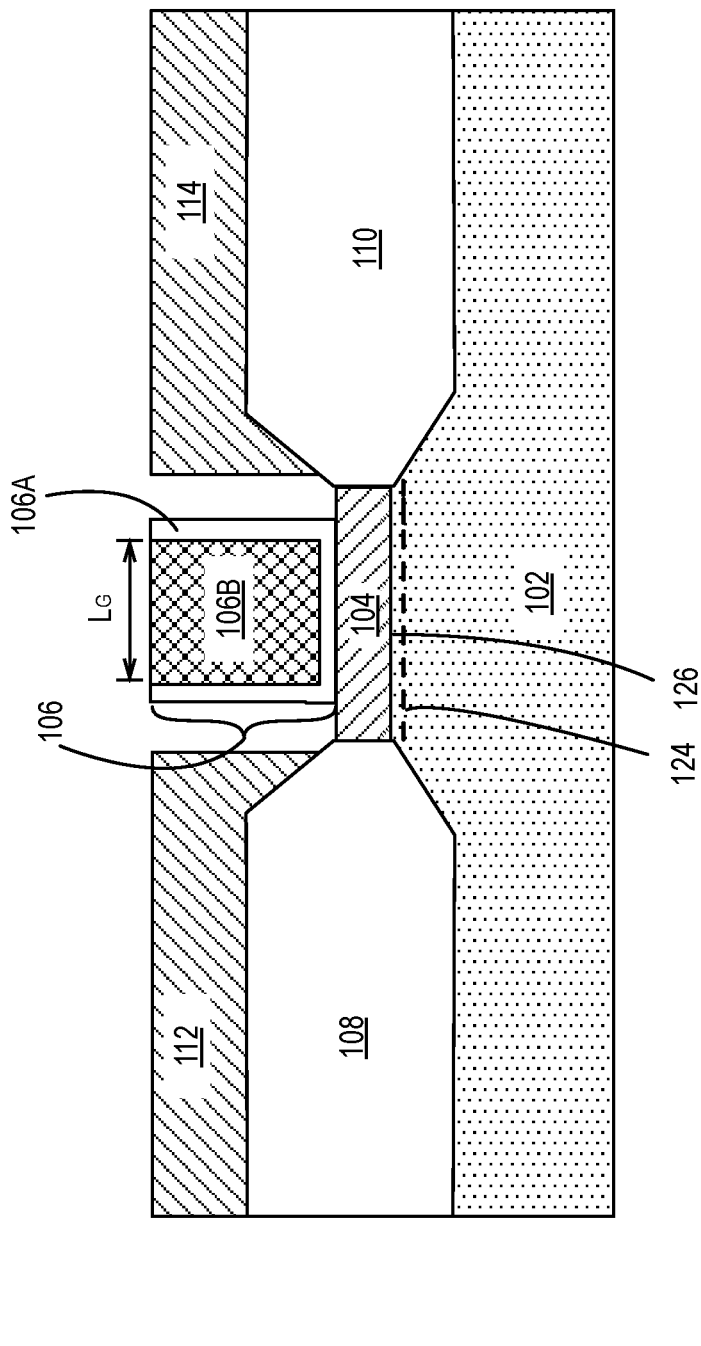
FIG. 1F illustrates a cross-sectional view of a group III-N transistor having a source structure and a drain structure with enhanced surface area, in an accordance with an embodiment of the present disclosure.

FIG. 1F illustrates a cross-sectional view (normal to the Y-Z plane) of the device 100, in an accordance with an embodiment of the present disclosure. In an embodiment, the gate 106 includes a gate dielectric layer 106A and a gate electrode 106B. In the illustrated embodiment, the gate dielectric layer 106A is between the polarization charge inducing layer 104 and the gate electrode 106B and also on sidewalls of the gate electrode 106B.

In an embodiment, the polarization charge inducing layer 104 includes a suitable second III-N material which induces strain in the first III-N material 102, below an interface between the second III-N material and the first III-N material. In an embodiment, the polarization charge inducing layer 104 includes a strain inducing material such as but not limited to Al$_z$Ga$_{1-z}$N, Al$_w$In$_{1-w}$N, or AlN, where Z ranges from 0.2-0.3 and W ranges from 0.7-0.85. One combination includes a polarization charge inducing layer 104 that is AlGaN and a first III-N material 102 that is GaN. In one such combination, the AlGaN polarization charge inducing layer 104 has a bandgap (3.7 eV) that is wider than the bandgap of the GaN III-N material 102 (3.4 eV), facilitating a quantum well at the interface between the AlGaN polarization charge inducing layer 104 and the GaN III-N material 102. In an embodiment, the polarization charge inducing layer 104 introduces a polarization difference in an upper interface 126 between terminal structure 102 and the polarization charge inducing layer 104, creating a conducting sheet of charge known as a 2-dimensional electron gas (2DEG—represented by dashed lines 124) in the terminal structure 102. The presence of the 2DEG leads to current conduction between the source structure 108 and the drain structure 110 in the device 100. By negatively biasing the gate relative to the drain contact 110, the 2DEG is turned off.

The gate dielectric layer 106A may have a high relative permittivity (i.e., dielectric constant, K). In some high-K gate dielectric embodiments, the gate dielectric layer 106A is a metal oxide (e.g., including oxygen and one or more metals, such as, but not limited to, aluminum, hafnium, zirconium, tantalum or titanium). In another embodiment, the gate dielectric layer 106A includes a silicon dioxide or a silicon nitride. In some examples, the gate dielectric layer 106A has a thickness between 2 nm and 10 nm.

In an embodiment, the gate electrode 106B includes a metal such as but not limited to Pt, Ni and an alloy such as TiN or TaN. In one such embodiment, the gate electrode 106B has a length, $L_G$, approximately in the range of 10-30 nm. In some embodiments, the gate electrode 106B further includes a work function metal and a gate cap. The work function metal may include a metal such as Pt, Ni, and an alloy such as TiN or TaN and the gate cap may include a metal such as W.

FIGS. 2A-10A and FIGS. 2B-10B illustrate plan and cross-sectional views, respectively, representing various operations in a method of fabricating a group III-N transistor, in accordance with embodiments of the present disclosure. In the illustrative embodiments, the plan view illustrations are not drawn to scale with the cross-sectional illustrations. Furthermore, all cross-sectional views in FIGS. 2B-10B, unless otherwise specified, are taken along a line A-A' in the plan view illustrations in FIGS. 2A-10A.

Figure 2A:
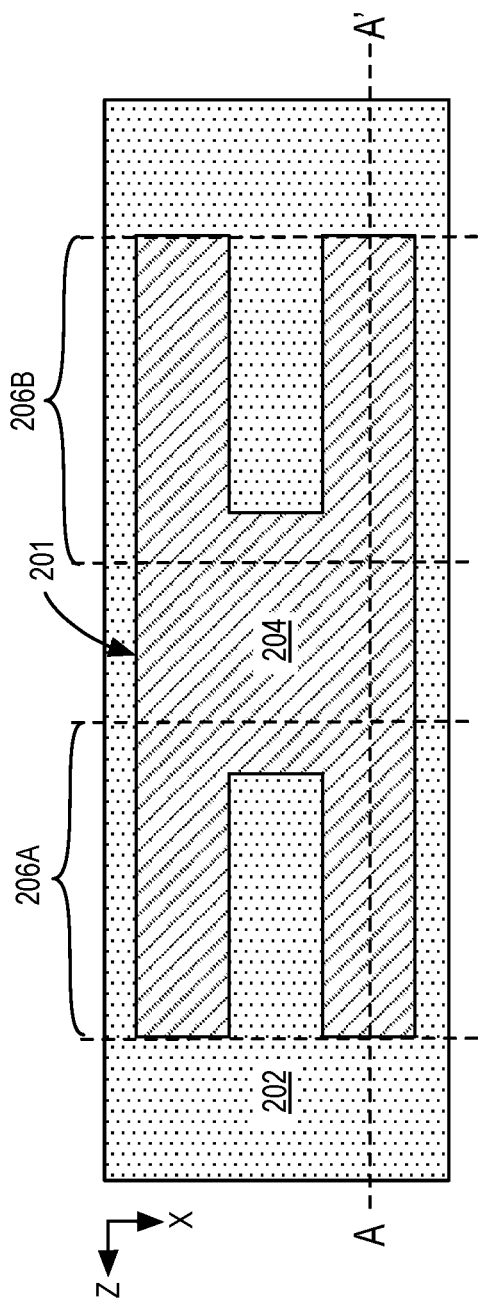
FIGS. 2A illustrates a plan view of a patterned polarization charge inducing layer on a patterned III-N material, in an accordance with an embodiment of the present disclosure.
Figure 2B:
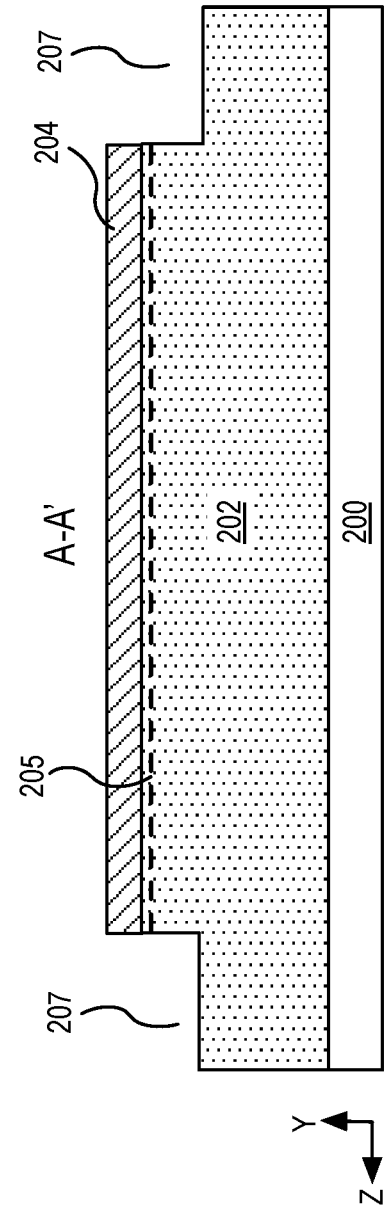
FIG. 2B illustrates a cross-sectional view of a patterned polarization charge inducing layer on a patterned III-N material, in an accordance with an embodiment of the present disclosure.

FIGS. 2A-2B illustrate a plan view and a cross sectional view, respectively of a patterned polarization charge inducing layer 204 on a patterned first III-N material 202 formed above a substrate 200, in an accordance with an embodiment of the present disclosure. Referring to FIG. 2B, in an embodiment, the first III-N material 202 is grown on the substrate 200 by a metal organic chemical vapor deposition (MOCVD) process at a temperature in the range of 1000-1100 degrees Celsius. In an embodiment, the first III-N material 202 has a material composition that is the same or substantially the same as the first III-N material utilized in terminal structure 102. In an embodiment, the III-N material 202 is a GaN layer. In an embodiment, the GaN III-N material 202 is grown to a thickness that is approximately in the range of 100 nm-5 micrometers. The first III-N material 202 may have a defect density less than (1e10/cm2) when grown to a sufficient thickness, such as a thickness of at least 100 nm.

In an embodiment, the polarization charge inducing layer 204 is formed on the first III-N material 202. The polarization charge inducing layer 204 may be formed using a MOCVD process and grown immediately after the growth of the first III-N material 202. In an embodiment, the polarization charge inducing layer 204 is grown by a MOCVD process at a temperature in the range of 1000-1100 degrees Celsius. Depending on the embodiment, the polarization charge inducing layer 204 includes a material such as but not limited to AlN, AlInN or $Al_yGa_{1-y}N$ (where y is 0.24-0.36) and the first III-N material includes a material such as but not limited to InGaN or GaN. The polarization charge inducing layer 204 may be grown to a thickness between 3 nm and 20 nm. In an exemplary embodiment, the polarization charge inducing layer 204 is AlInN. A polarization charge inducing layer 204 having a thickness between 3 nm-10 nm may induce strain in an uppermost surface of the III-N material 202. The presence of sufficient strain in the first III-N material 202 induces 2DEG (represented by dashed lines 205) in the strained region.

In an embodiment, the substrate 200, includes a semiconductor material such as but not limited to silicon, silicon germanium (Ge) or silicon carbide (SiC). In an exemplary embodiment, the substrate 200 is a silicon substrate having a (100) top surface. A silicon substrate 200 with a (100) top surface enables co-integration of silicon CMOS transistor technology with a III-N material. In a second embodiment, the silicon substrate 200, has a (111) top surface. In embodiments, the first III-N material 202 and the substrate 200 have mismatched lattice structures. The lattice mismatch between the first III-N material 202 and the substrate 200 may be between 15%-50%.

An example of an outline 201 of the mask, illustrated in the plan view illustration of FIG. 2A, defines the shape of a terminal structure that will be subsequently formed. In an embodiment, a mask (not shown) is formed on the polarization charge inducing layer 204. In one embodiment, a plasma etch process is utilized to etch the polarization charge inducing layer 204 and the first III-N material 202 through an exposed area in the mask. In the illustrative embodiment, the terminal structure, to be formed in a subsequent operation, has two fins in each of the source and drain regions, 206A and 206B, respectively. Referring to the cross-sectional illustration of FIG. 2B, an opening 207 is formed sufficiently deep to subsequently define isolation regions. In one embodiment, the opening 207 has a depth between 75 nm and 200 nm.

Figure 3A:
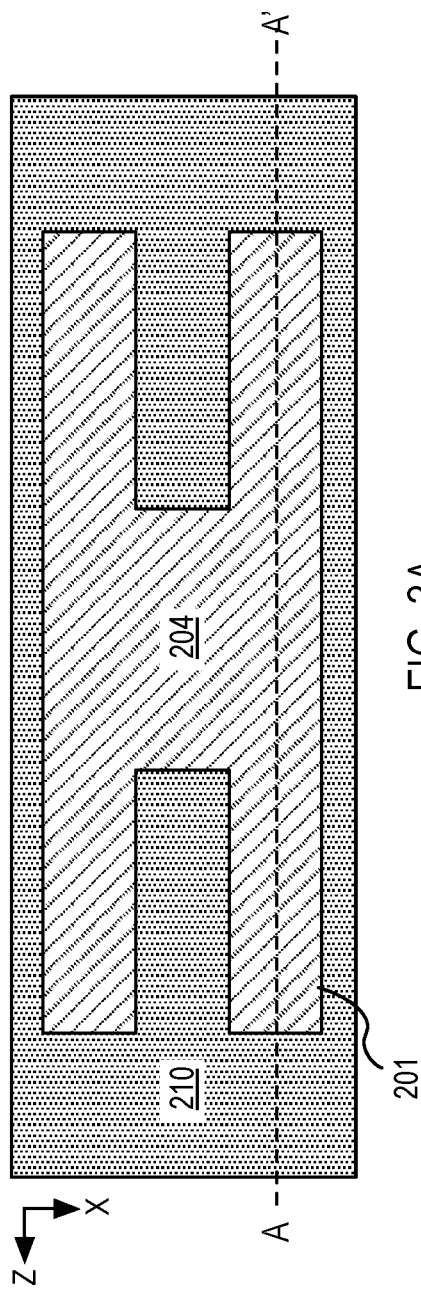
FIG. 3A illustrates a plan view of the structure of FIG. 2A following the formation of isolation structures surrounding the patterned polarization charge inducing layer and the patterned III-N material.
Figure 3B:
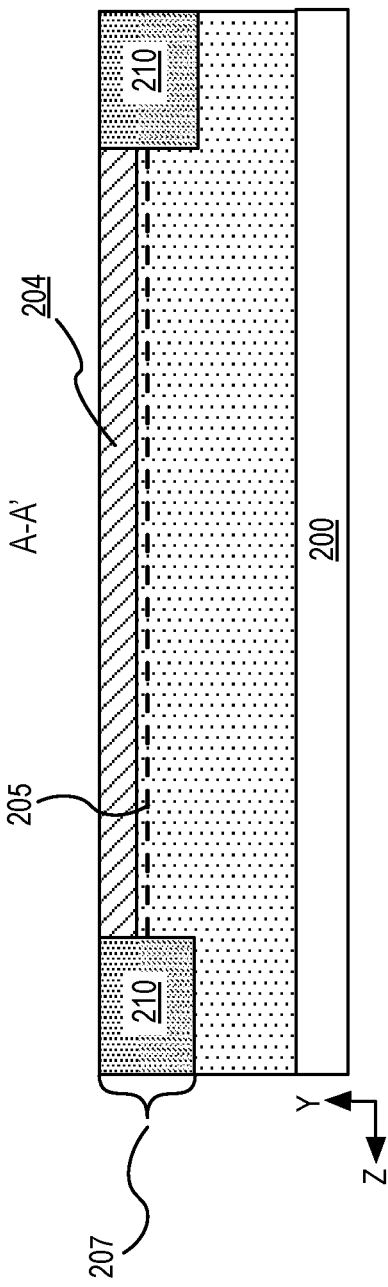
FIG. 3B illustrates a plan view of the structure of FIG. 2B following the formation of isolation structures surrounding the patterned polarization charge inducing layer and the patterned III-N material.

FIGS. 3A and 3B illustrate a plan view and a cross-sectional view, respectively of the structures of FIGS. 2A and 2B, respectively, following the formation of an isolation layer 210 surrounding the polarization charge inducing layer 204 and the patterned first III-N material 202. In an embodiment, an isolation layer 210 is blanket deposited on the surface of the polarization charge inducing layer 204 and on the patterned first III-N material 202. Examples of the isolation layer 210 may include any material that is sufficiently strong to provide electrical isolation such as, but not to, limited silicon dioxide, silicon nitride, silicon oxynitride, carbon doped nitride and carbon doped oxide. The isolation layer 210 may be deposited by a variety of insulator deposition processes such as but not limited to physical vapor deposition (PVD), chemical vapor deposition (CVD) or plasma enhanced chemical vapor deposition (PECVD) process. Post deposition, the isolation layer 210 is subsequently planarized, for example using a chemical mechanical polish process. In the embodiment depicted in FIG. 3B, the CMP process leaves the isolation layer 210 having an uppermost surface that is co-planar or substantially co-planar with an uppermost surface of the polarization charge inducing layer 204.

Figure 4A:
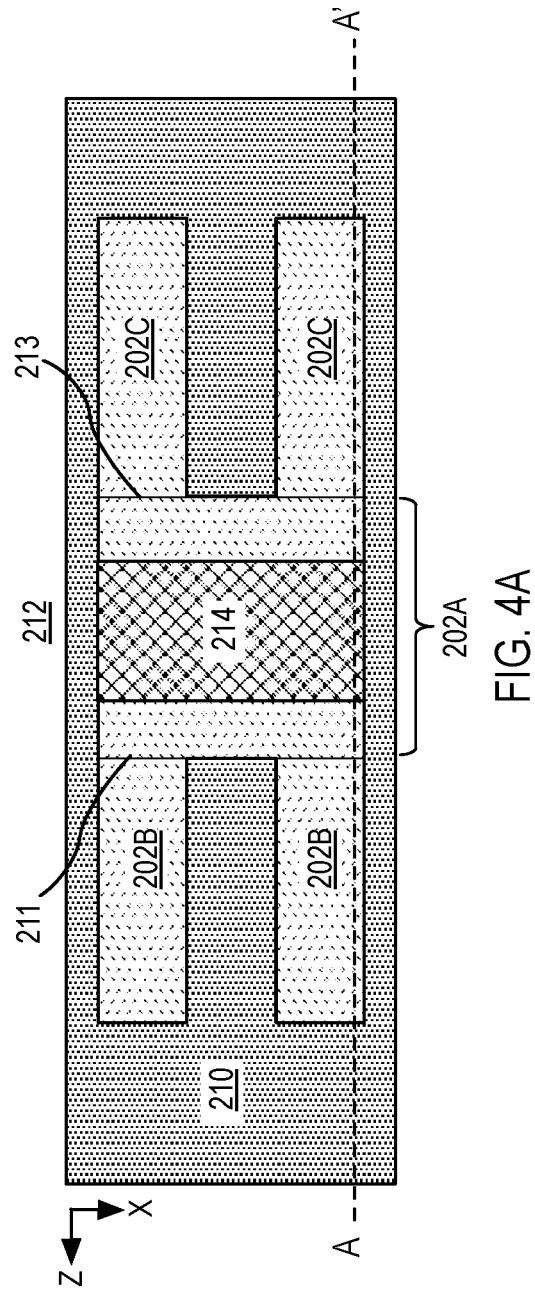
FIG. 4A illustrates a plan view of the structure of FIG. 3A following the formation of trenches in portions of the polarization charge inducing layer, and in portions of the III-N material adjacent to the isolation structures.
Figure 4B:
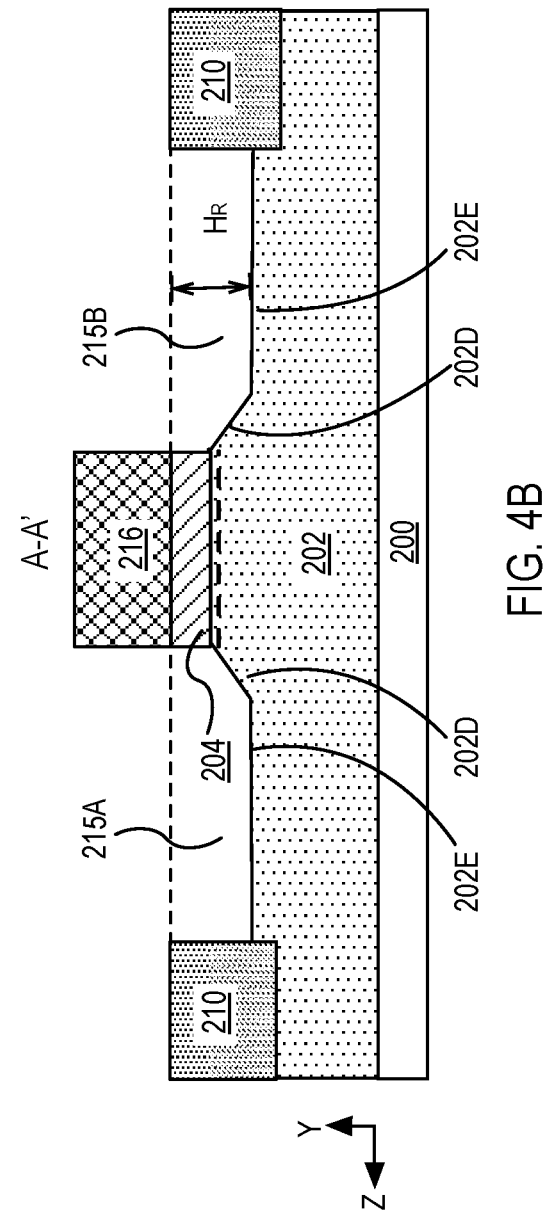
FIG. 4B illustrates a cross-sectional view of the structure of FIG. 3B following the formation of trenches in portions of the polarization charge inducing layer, and in portions of the III-N material adjacent to the isolation structures.

FIGS. 4A and 4B illustrate a plan view and a cross-sectional view, respectively, of the structures of FIGS. 3A and 3B, respectively following the formation of a terminal structure 212 by patterning portions of the polarization charge inducing layer 204, and portions of the first III-N material 202 adjacent to the isolation layer 210. Referring to FIG. 4B, in an embodiment, a mask 214 is formed on a portion of the polarization charge inducing layer 204. The mask 214 may include a material that can withstand high temperature processing such as a silicon oxide or a silicon nitride. In an embodiment, a plasma etch process is utilized to pattern the polarization charge inducing layer 204 and the first III-N material 202 uncovered by the mask 214, to form trenches 215A and 215B as shown in FIG. 4B. Patterning of trenches 215A and 215B in the first III-N material 202 forms the terminal structure 212 having a central body 202A, a first plurality of fins 202B adjacent to a first side 211 of the central body 202A, and a second plurality of fins 202C adjacent to a second side 213 of the central body 202A as depicted in the plan view illustration of FIG. 4A. In an embodiment, the terminal structure, 212, has a sloped sidewalls 202D and an approximately flat lowermost surfaces 202E. The sloped sidewalls 202D may be defined by a linear facet or have sidewall profile that has a compound slope (not depicted).

The cross-sectional illustration of FIG. 4A shows an amount of recess, $H_R$, of the trenches 215A and 215B. In an embodiment, $H_R$, is between 30 nm and 100 nm. The trenches 215A and 215B may have a height and width chosen to enable subsequent epitaxial formation of source and drain structures having a contact resistance of less than 200 ohms-micron.

FIGS. 5A and 5C illustrate plan view and cross-sectional views, of the structures of FIG. 4A and 4B, following the formation of source structure 216 in the trench 215A and source structure 218 in the trench 215B. In an embodiment, the source structure 216 and the drain structure 218 include a third III-N material that is the same or substantially the same as the third III-N material of the source structure 108 and drain structure 110, respectively.

As shown in the plan view illustration of FIG. 5A, the source structure 216 forms a continuous structure over a portion of the central body 202A and over the first plurality of fins 202B and the drain structure 218 forms a continuous structure over a portion of the central body 202A and over the second plurality of fins 202C. The plan view illustration provides an outline of the spatial extent of the source structure 216 and the drain structure 218. Epitaxial growth of drain structure 218 crystalline material may utilize a variety of techniques and processing chamber configurations. In the illustrated embodiment, in a process known as lateral epitaxial overgrowth (LEO), conditions are engineered to favor advancing a lateral growth face of a nucleated crystal of the source structure 216 and the drain structure 218 to extend over portions of the isolation layer 210.

As shown in FIG. 5B, in an embodiment, the source structure 216 and the drain structure 218 are grown from the exposed, undamaged surface of terminal structure 202 using a metal organic chemical vapor deposition MOCVD process. The MOCVD process may be carried out at process temperatures between 1000 and 1100 degrees Celsius. In an embodiment, the source structure 216 and the drain structure 218, are epitaxially grown sufficiently thick to fill trenches 215A and 215B respectively and extend vertically to a have a height, $H_E$, as measured from an upper surface of the fin structure 202A and 202B, respectively. Examples of the height $H_E$ is between 60 nm-100 nm. In the illustrated example, the LEO process causes a sidewall of the source structure 216 to overgrow laterally onto an isolation layer surface 210 and causes a sidewall of the drain structure 218 to overgrow laterally onto an isolation layer surface 210. FIG. 5B represents an embodiment of the source structure 216 and the drain structure 218 having corrugated upper surfaces 216D and 218D, respectively. In some examples, the corrugation is between 5 nm-20 nm.

The cross-sectional illustration of FIG. 5C, taken along a direction B-B' of the plan view illustration of FIG. 5A shows a profile of the source structure 216 that is the same or substantially the same as the profile of the source structure 108 described in FIG. 1E. Each portion of the source structure 216 formed over the fins 202B has sidewalls 216A and 216B. In the example illustrated, the different portions of the source structure 216 grown over the first plurality of fins 202B do not merge because of the spacing, $W_S$, between the individual fins 202B, resulting in a gap, $G_S$. Extending the epitaxial overgrowth process may cause sidewalls 216A and 216B to reduce the gap, $G_S$. In an embodiment the gap, $G_S$, may be reduced to approximately 5 nm-10 nm. Having a smaller gap, $G_S$, may be advantageous in increasing the effective area of the source structure 216.

In an embodiment, when the height $H_E$ of the source structure 216 is approximately equal to the fin width, $W_F$, and when the sidewalls 216A and 216B each have an angle of approximately 60 degrees, the lateral epitaxial process can cause the sidewalls to merge at an apex such as is depicted in the cross-sectional illustration of the source structure 108 in FIG. 1C. In a further embodiment, the further extending the LEO process can cause the sidewalls 216A and 216B to merge at an apex as well as merge on the isolation layer surface 210, resulting in a source structure that similar to the source structure 108 depicted above in the cross-sectional illustration of FIG. 1D.

It is to be appreciated that drain structure 218D also has one or more features of the source structure 216 such as including lateral epitaxially overgrown sidewalls sloping at approximately 60 degrees and corrugated uppermost surfaces.

The cross-sectional illustration of FIG. 5B also depicts an embodiment where the source structure 216 is grown to meet one sidewall of the polarization charge inducing layer 204 and the drain structure 218 is epitaxially grown to meet a second opposing sidewall of the polarization charge inducing layer 204. In such an embodiment, the source structure 216 and the drain structure 218 come into direct contact with the 2DEG (dashed lines 205) under the polarization charge inducing layer 204. In the illustrated example, the presence of the mask 214 prevents the source structure 216 and the drain structure 218 from extending onto the polarization charge inducing layer 204. It is to be appreciated that source sidewall 216C and drain sidewall 218C may also facet at approximately 60 degrees with respect to the plane of the terminal structure 202. Sidewalls 216C and 218C may also provide increased surface area for source and drain contacts to be subsequently formed.

Figure 6A:
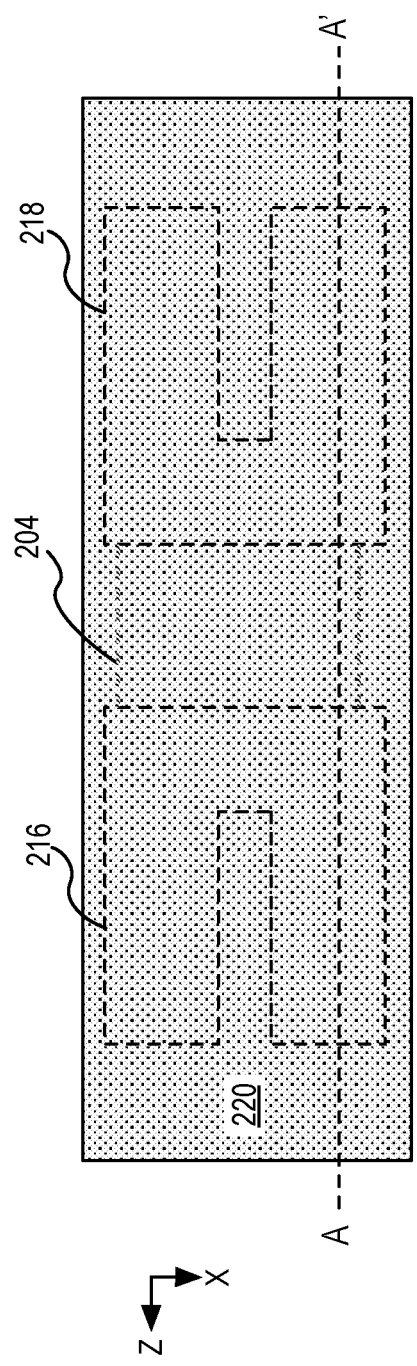
FIG. 6A illustrates a plan view of the structure of FIG. 5A following the deposition of a dielectric layer on the source structure, drain structure and on the polarization charge inducing layer.
Figure 6B:
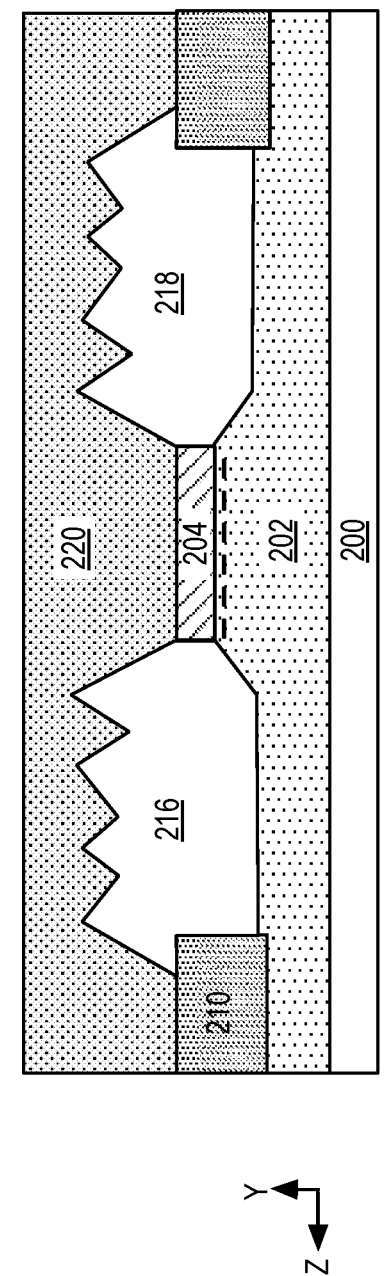
FIG. 6B illustrates a cross-sectional view of the structure of FIG. 5B following the deposition of a dielectric layer on the source structure, drain structure and on the polarization charge inducing layer.

FIGS. 6A and 6B illustrates a plan view and a cross-sectional view, respectively, of the structure of FIG. 5A and 5B, respectively, following the removal of the mask 214 and deposition of a dielectric layer 220 on the source structure 216, drain structure 218 and on the polarization charge inducing layer 204 and on the isolation layer 210. In an embodiment, the dielectric layer 220 includes a material that is the same or substantially the same as the material of the mask 214. In some examples, the dielectric layer 220 is blanket deposited by a physical vapor deposition (PVD) or a chemical vapor deposition (CVD) process and then planarized for subsequent processing.

FIG. 7A and 7B illustrate a plan view and a cross-sectional view, respectively, of the structure of FIGS. 6A and 6B, respectively, following the formation of a gate opening 221 in the dielectric layer 220 over a portion of the polarization charge inducing layer 204. Referring to FIG. 7B, in an embodiment, a photoresist mask (not shown) is patterned over the dielectric layer 220, where the pattern defines a location for an opening to be formed relative to the polarization charge inducing layer 204. In one embodiment, a plasma etch process is utilized to form the opening 221 in the dielectric layer 220, selectively to the underlying polarization charge inducing layer 204 as shown in the cross-sectional illustration of FIG. 7B taken along the direction A-A' of the plan view illustration of FIG. 7A. In an embodiment, gate opening 221 has a width, at the bottom of the opening, $W_B$, that is approximately between 50 nm-500 nm as shown in the cross-sectional illustration. In the exemplary embodiment, the gate opening 221 exposes a portion of the isolation layer 210 as illustrated in the plan view illustration of FIG. 7A.

Figure 8A:
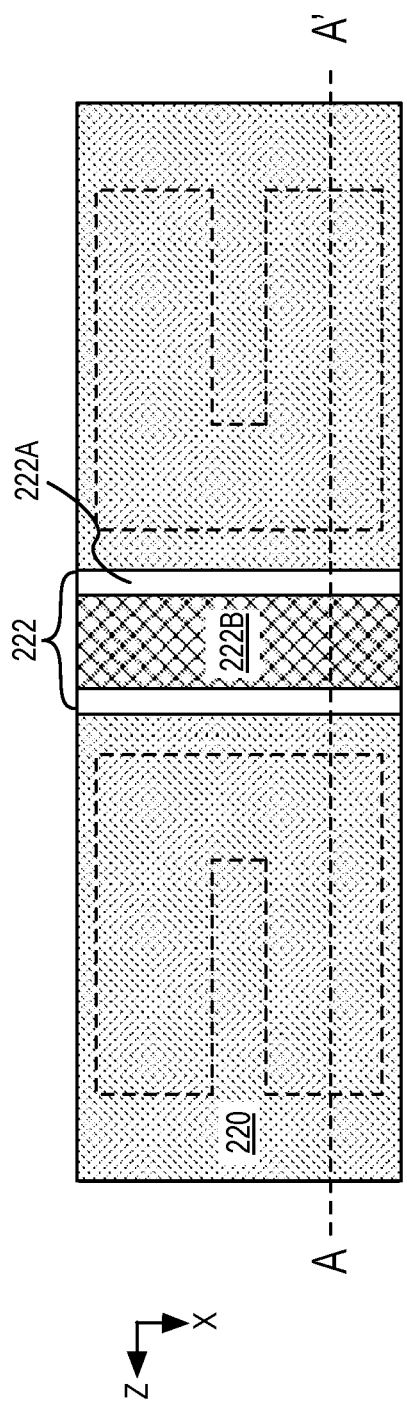
FIG. 8A illustrates a plan view of the structure of FIG. 7A following the formation of a gate in the opening and on the polarization charge inducing layer.
Figure 8B:
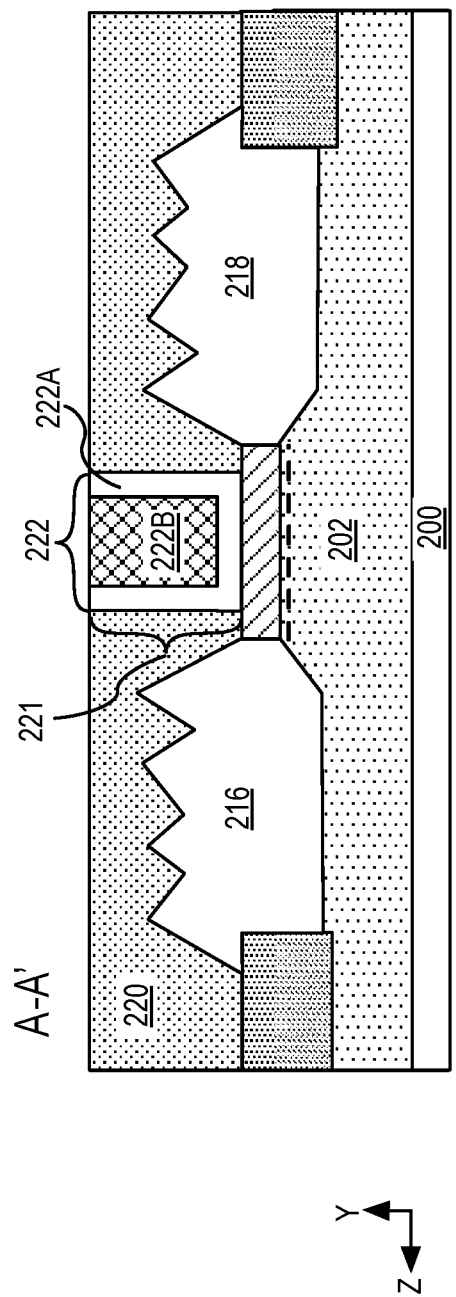
FIG. 8B illustrates a cross-sectional view of the structure of FIG. 7B following the formation of a gate in the opening and on the polarization charge inducing layer

FIG. 8A and 8B illustrate a plan view and a cross-sectional view, respectively, of the structure of FIGS. 7A and 7B, respectively, following the formation of a gate 222 in the gate opening 221 and on a portion of the polarization charge inducing layer 204. Referring to Figure 8B, in an embodiment, a gate dielectric layer 222A is first blanket deposited on a portion of the polarization charge inducing layer 204 exposed by the gate opening 221, and on the dielectric layer 220. The gate dielectric layer 222A is also disposed on sidewalls of the dielectric layer 220 in the gate opening 221. Suitable materials and thicknesses for the gate dielectric layer 222A are same as or substantially the same as the material and thicknesses of the gate dielectric layer 106A. In an embodiment, the gate dielectric layer 222A, is formed by an atomic layer deposition (ALD) process or a PVD process. A gate electrode layer 222B is then blanket deposited on the gate dielectric layer 222A in the gate opening 221. Examples of the gate electrode layer 222B include a material that is the same as or substantially the same as the material of the gate electrode layer 106B described in association with FIG. 1F. In an embodiment, the gate electrode 222B includes a layer of a work function metal deposited in the gate opening 221 on the gate dielectric layer 222A and a gate cap layer deposited on the work function metal. After deposition of the gate dielectric layer 222A and the gate electrode layer 222B, a planarization process is performed to remove the gate dielectric layer 222A and the gate electrode layer 222B from an uppermost surface of the dielectric layer 220. In an embodiment, the planarization process includes a chemical mechanical polish process, where the CMP process forms a gate 222 having an uppermost surface that is co-planar or substantially co-planar with the uppermost surface of the dielectric layer 220 as shown in the cross-sectional illustration of FIG. 8B.

FIGS. 9A and 9B illustrate a plan view and a cross-sectional view, respectively, of the structure of FIGS. 8A and 8B, respectively, following the formation of an opening 223A such as a source contact opening, above the source structure 216 and an opening 223B such as a drain contact opening above the drain structure 218. Referring to FIG. 9B, in an embodiment, a photoresist mask (not shown) is patterned over the dielectric layer 220 and the gate 222, where the pattern defines a location for the opening 223A and the opening 223B to be formed relative to the source structure 216 and the drain structure 218, respectively.

In one embodiment, a plasma etch process is utilized to form the opening 223A and opening 223B in the dielectric layer 220, selectively to the underlying source structure 216 and the drain structure 218, respectively. The plasma etch may cause some corner rounding of the corrugated upper surfaces 216E and 218E.

In an embodiment, the opening 223A exposes a portion of the source structure 216 and a portion of the isolation layer 210 laterally surrounding the source structure 216 as shown in the plan view illustration of FIG. 9A. In a different embodiment, the opening 223A can be extended to expose a portion of the source contact sidewall 216C or the entire source contact sidewall 216C. In an embodiment, the opening 223A can be large enough to expose an entire upper surface area of source structure 216.

Similarly, in the illustrated embodiment, the opening 223B exposes a portion of the drain structure 218 and a portion of the isolation layer 210 laterally surrounding the source structure 216 as shown in the plan view illustration of FIG. 9A. In a different embodiment, the opening 223B can extend to expose a portion of the drain structure sidewall 218C as illustrated in FIG. 9B. In a different embodiment, the opening 223B can be large enough to expose an entire upper surface area of drain structure 218.

In an embodiment, the plasma etch process undergoes a clean-up process in order to completely expose the upper surfaces of the source structure 216 and the drain structure 218. In one such embodiment, the plasma etch completely removes the dielectric layer 220 from the region between the source structure 216 and from the region between the drain structure 218 to expose the underlying isolation layer 210 as illustrated in the plan view illustration of FIG. 9A. In some embodiments, significant over etch can result in exposure of sidewalls of the patterned first III-N material 202 under sidewalls 216E and 218E of the source structure 216 and drain structure 218, respectively.

FIG. 10A and 10B illustrate a plan view and a cross-sectional view, respectively, of the structure of FIGS. 9A and 9B following the formation of a drain contact 226 in the drain contact opening 223B on the drain structure 218 and a source contact 228 in the source contact opening 223A on the source structure 216.

Referring to FIG. 10B, in an embodiment, one or more layers of contact metal are deposited inside each of the openings 223A and 223B on exposed surfaces of the source structure 216 and on exposed surfaces of the drain structure 218, respectively. In the illustrative embodiment, the one or more layers of the contact metal are also blanket deposited on exposed portions of the isolation layer 210 and on the uppermost surface of the dielectric layer 220 and on the gate 222. In an embodiment, the one or more layers of contact metal are deposited using a plasma enhanced chemical vapor deposition (PECVD) or an ALD process. In an embodiment, suitable contact metals include metals such as but not limited to Ti, Al or Ni. In an embodiment, a tungsten capping layer is deposited on the one or more layers of contact metal. In an embodiment, where the tungsten capping layer is deposited on the one or more layers of contact metal, the one or more layers of contact metal is first deposited on the bottom and on the sides of the opening 223A and 223B and the tungsten capping layer is deposited to fill the remaining portion of the openings 223A and 223B. In an embodiment, the one or more layers of contact metal is deposited to a thickness in the range of 10-30 nm, and the tungsten capping layer is deposited to fill the remaining portion of each of the openings 223A and 223B.

A planarization process is carried out to remove the one or more layers of contact metal from the uppermost surface of the dielectric layer 220. In one embodiment, the planarization process includes a chemical mechanical polish (CMP) process. The CMP process removes all the one or more layers of contact metal from the uppermost surfaces of the dielectric layer 220, and from the uppermost surface of the gate 222. The CMP process leaves the one or more layers of contact metal in the openings 223A and 223B to form a source contact 226 and a drain contact 228 as shown in the cross-sectional illustration of FIG. 10B.

It is to be appreciated that maximizing a contact area between the source contact 226 and the source structure 216, formed over a plurality of fins, can help to reduce the contact resistance between the source structure 216 and the source contact 226 by as much as 70% compared to a contact resistance between a source contact and a source structure formed over a large first single fin of a planar terminal structure having a central body, and a large second single fin opposite to the large first single fin. It is to be appreciated that maximizing a contact area between the drain contact 228 and the drain structure 218, formed over a plurality of fins, can help to reduce the contact resistance between the drain contact 228 and the drain structure 218 by as much as 70% compared to a contact resistance between a drain contact and a drain structure, formed over the large second single fin of the planar terminal structure. In an embodiment, the contact resistance between the source contact 226 and the source structure 216 or between the drain contact 228 and the drain structure 216 can have a value of less than 200 ohm-micron.

The cross-sectional illustration in FIG. 10C taken along a direction B-B' in the FIG. 10C illustrates one of the dimensions of the area of contact between the source contact 226 and the source structure 216. The cross-sectional illustration highlights the area advantage obtained through contact between the source structure 216 and sidewalls 216A and 216B of the source structure 216. Additionally, the corrugation in the source structure 216 also enables a larger contact surface to be obtained.

Figure 11:
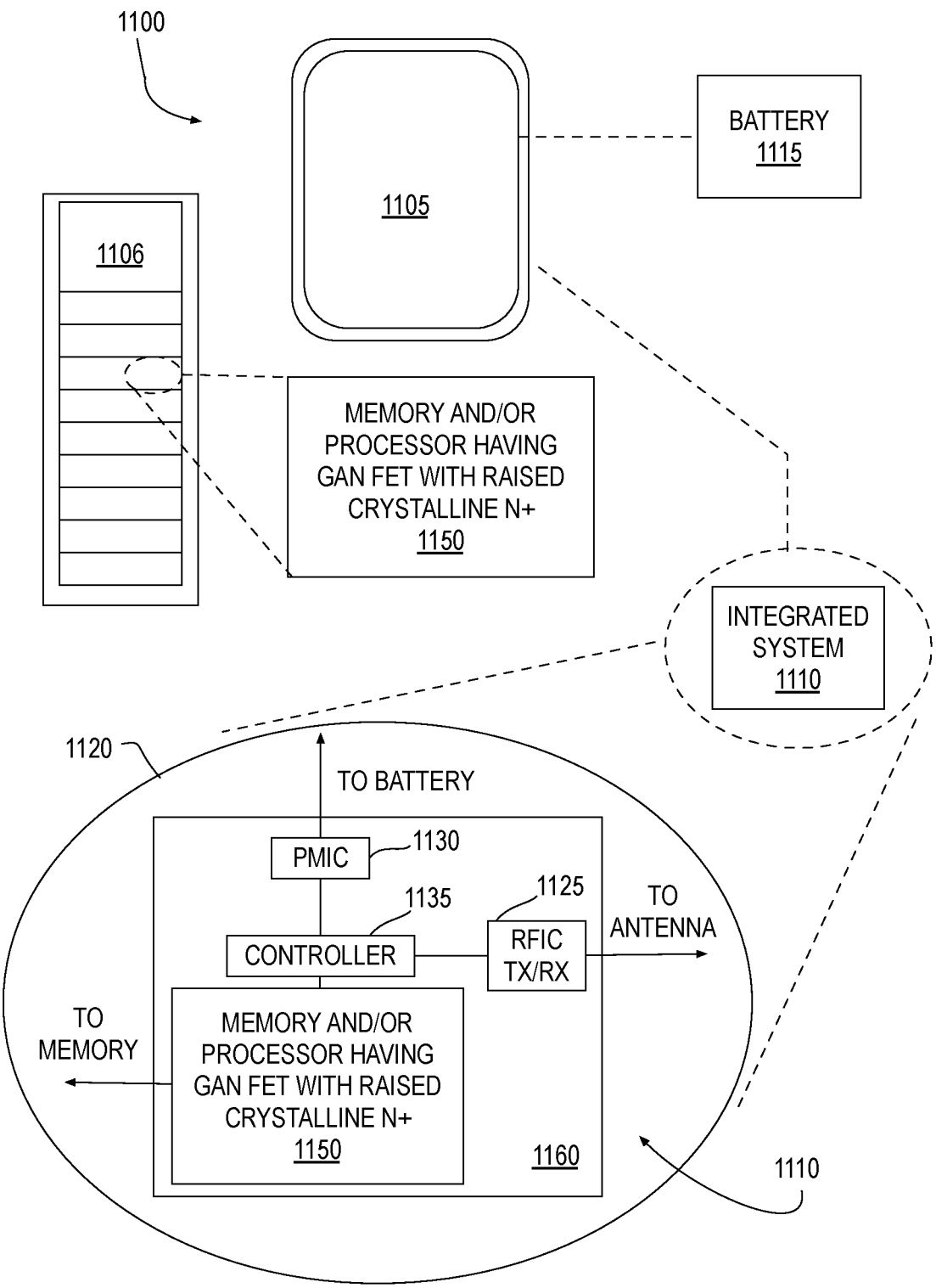
FIG. 11 is a functional block diagram of a group III-N SoC implementation of a mobile computing platform, in accordance with an embodiment of the present disclosure.

FIG. 11 illustrates a system 1100 in which a mobile computing platform 1105 and/or a data server machine 1106 employs an IC including at least one group III-N transistor, such as the device 100 including an epitaxially grown source and drain structures, formed on fins, where the source and drain structures have surface areas that offer a large contact area for a given footprint of the fin, in accordance with embodiments of the present disclosure. The server machine 1106 may be any commercial server, for example including any number of high-performance computing platforms disposed within a rack and networked together for electronic data processing, which in the exemplary embodiment includes a packaged monolithic IC 1150. The mobile computing platform 1105 may be any portable device configured for each of electronic data display, electronic data processing, wireless electronic data transmission, or the like. For example, the mobile computing platform 1105 may be any of a tablet, a smart phone, laptop computer, etc., and may include a display screen (e.g., a capacitive, inductive, resistive, or optical touchscreen), a chip-level or package-level integrated system 1110, and a battery 1115.

Whether disposed within the integrated system 1110 illustrated in the expanded view 1120, or as a stand-alone packaged chip within the server machine 1106, packaged monolithic IC 1150 includes a memory chip (e.g., RAM), or a processor chip (e.g., a microprocessor, a multi-core microprocessor, graphics processor, or the like) including at least one group III-N transistor, such as the device 100 including an epitaxially grown source and drain structures formed on fins, for example as describe elsewhere herein. The monolithic IC 1150 may be further coupled to a board, a substrate, or an interposer 1160 along with, one or more of a power management integrated circuit (PMIC) 1130, RF (wireless) integrated circuit (RFIC) 1125 including a wideband RF (wireless) transmitter and/or receiver (TX/RX) (e.g., including a digital baseband and an analog front end module further comprises a power amplifier on a transmit path and a low noise amplifier on a receive path), and a controller thereof 1135.

Functionally, PMIC 1130 may perform battery power regulation, DC-to-DC conversion, etc., and so has an input coupled to battery 1115 and with an output providing a current supply to other functional modules. As further illustrated, in the exemplary embodiment, RFIC 1125 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 1150 or within a single IC coupled to the package substrate of the monolithic IC 1150.

Figure 12:
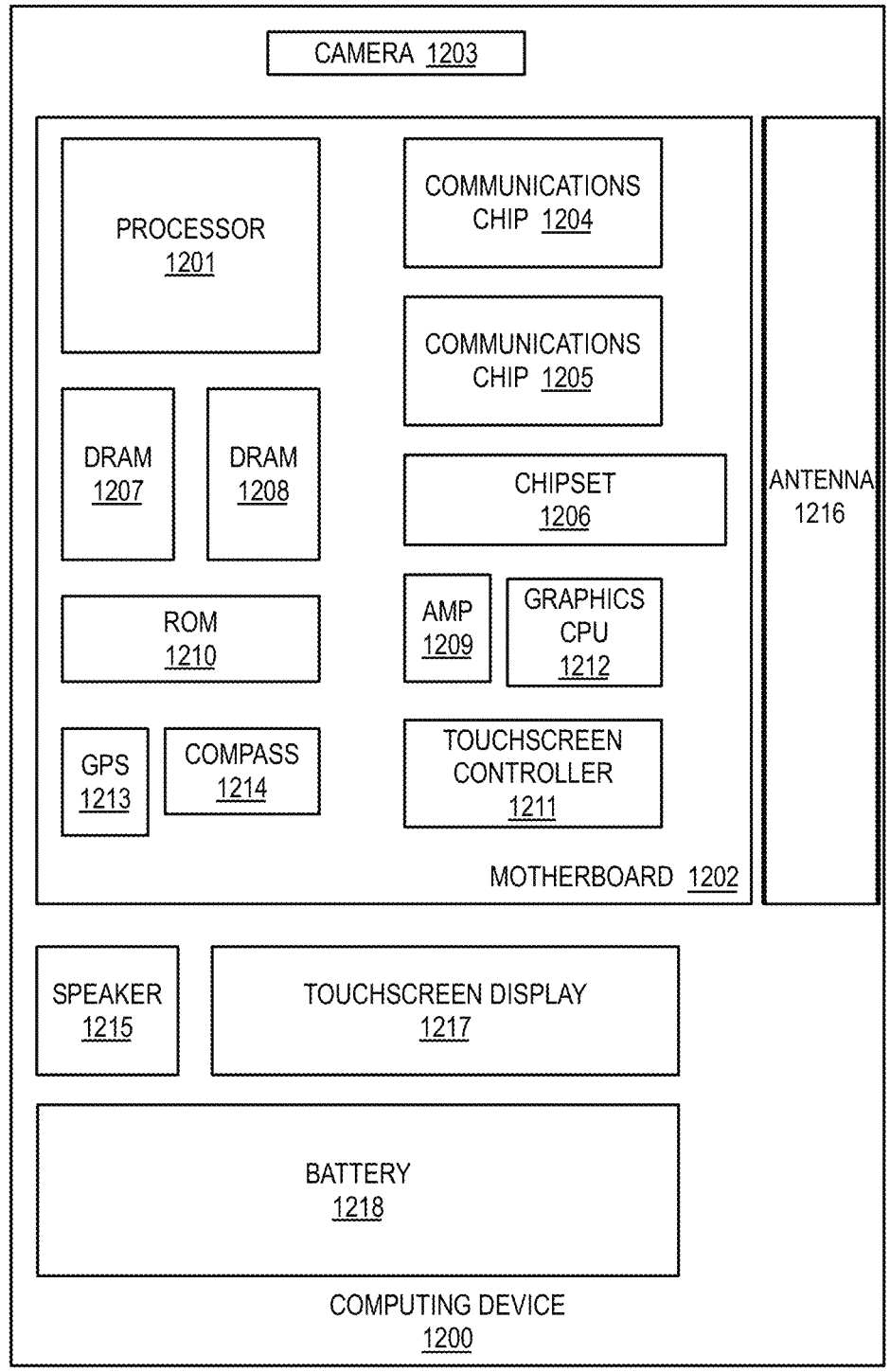
FIG. 12 illustrates a computing device in accordance with embodiments of the present disclosure.

FIG. 12 is a functional block diagram of a computing device 1200, arranged in accordance with at least some implementations of the present disclosure. Computing device 1200 may be found inside platform 1100, for example, and further includes a motherboard 1202 hosting a number of components, such as but not limited to a processor 1201 (e.g., an applications processor) and one or more communications chips 1204, 1205. Processor 1201 may be physically and/or electrically coupled to motherboard 1202. In some examples, processor 1201 includes an integrated circuit die packaged within the processor 1201. In general, the term "processor" may refer to any device or portion of a device that processes electronic data from registers and/or memory to transform that electronic data into other electronic data that may be stored in registers and/or memory. A device or component of computing device 1200 may include transistor(s) or transistor structure(s) such as III-N devices 100 including a terminal structure having a central body and a first plurality of fins, and a second plurality of fins, opposite the first plurality of fins integrated with or without silicon CMOS transistors.

In various examples, one or more communication chips 1204, 1205 may also be physically and/or electrically coupled to the motherboard 1202. In further implementations, communication chips 1204 may be part of processor 1201. Depending on its applications, computing device 1200 may include other components that may or may not be physically and electrically coupled to motherboard 1202. These other components may include, but are not limited to, volatile memory (e.g., DRAM) 1207, 1208, non-volatile memory (e.g., ROM) 1210, a graphics processor 1212, flash memory, global positioning system (GPS) device 1213, compass 1214, a chipset 1206, an antenna 1216, a power amplifier 1209, a touchscreen controller 1211, a touchscreen display 1217, a speaker 1215, a camera 1203, and a battery 1218, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 1204, 1205 may enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1204, 1205 may implement any of a number of wireless standards or protocols, including but not limited to those described elsewhere herein. As discussed, computing device 1200 may include a plurality of communication chips 1204, 1205. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

Figure 13:
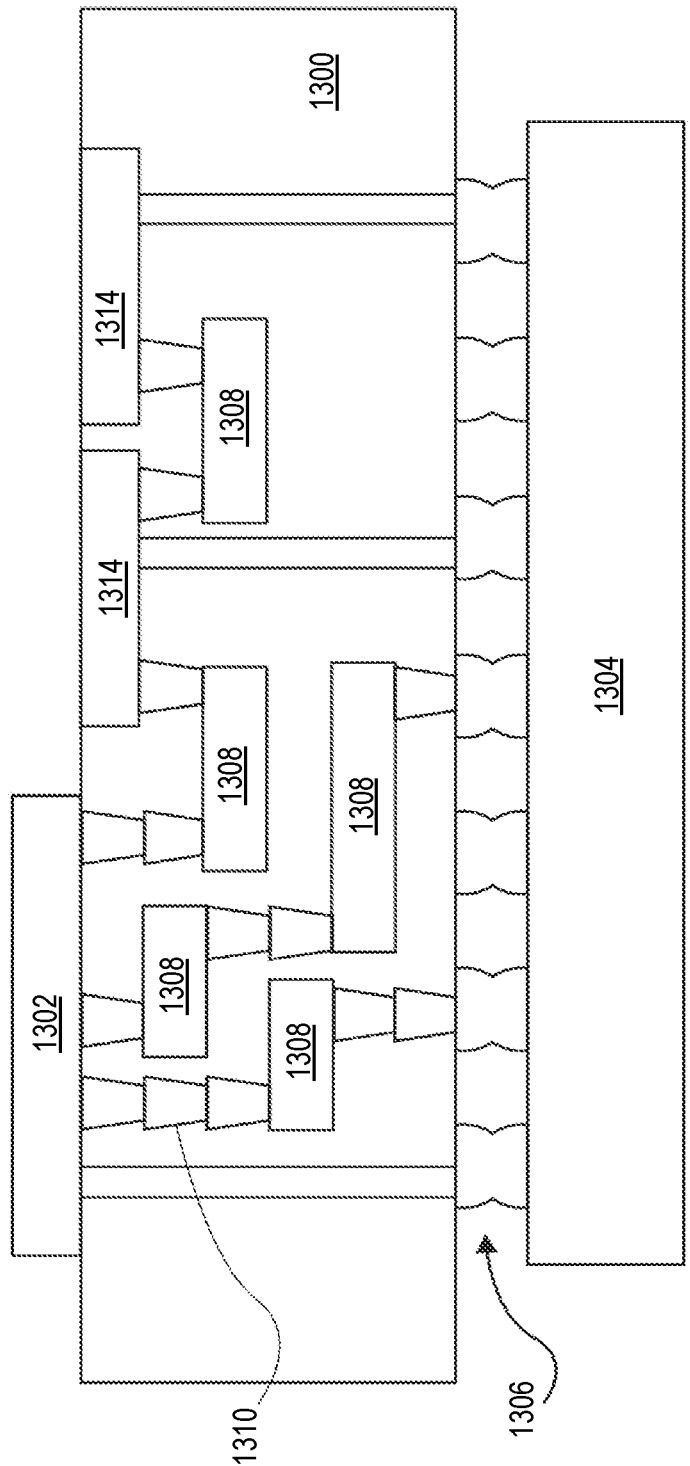
FIG. 13 illustrates an integrated circuit structure in accordance with embodiments of the present disclosure.

FIG. 13 illustrates an integrated circuit structure 1300 that includes one or more embodiments of the disclosure. The integrated circuit (IC) structure 1300 is an intervening structure used to bridge a first substrate 1302 to a second substrate 1304. The first substrate 1302 may be, for instance, an integrated circuit die. The second substrate 1304 may be, for instance, a memory module, a computer mother, or another integrated circuit die. The integrated circuit die may include one or more devices such as a III-N device 100 (transistor) including a terminal structure having a central body and a first plurality of fins, and a second plurality of fins, opposite the first plurality of fins, and source and drain structures on respective first and second plurality of fins, where the source and drain structures are designed for enhanced contact surface area and reducing contact resistance, for example. Generally, the purpose of an integrated circuit (IC) structure 1300 is to spread a connection to a wider pitch or to reroute a connection to a different connection. For example, an integrated circuit (IC) structure 1300 may couple an integrated circuit die to a ball grid array (BGA) 1306 that can subsequently be coupled to the second substrate 1304. In some embodiments, the first and second substrates 1302/1304 are attached to opposing sides of the integrated circuit (IC) structure 1300. In other embodiments, the first and second substrates 1302/1304 are attached to the same side of the integrated circuit (IC) structure 1300. And in further embodiments, three or more substrates are interconnected by way of the integrated circuit (IC) structure 1300.

The integrated circuit (IC) structure 1300 may be formed of an epoxy resin, a fiberglass-reinforced epoxy resin, a ceramic material, or a polymer material such as polyimide. In further implementations, the integrated circuit (IC) structure 1300 may be formed of alternate rigid or flexible materials that may include the same materials described above for use in a semiconductor substrate, such as silicon, germanium, and other group III-N, group III-V and group IV materials.

The integrated circuit (IC) structure 1300 may include metal interconnects 1308 and via 1310, including but not limited to through-silicon vias (TSVs) 1310. The integrated circuit (IC) structure 1300 may further include embedded devices 1314, including both passive and active devices. Such devices include, but are not limited to, capacitors, decoupling capacitors, resistors, inductors, fuses, diodes, transformers, group III-N transistors such as a III-N device 100 including a terminal structure having a central body and a first plurality of fins, and a second plurality of fins, opposite the first plurality of fins, one or more magnetic tunnel junction or resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 1300. In accordance with embodiments of the present disclosure, apparatuses or processes disclosed herein may be used in the fabrication of integrated circuit (IC) structure 1300.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

Thus, embodiments of the present disclosure include group III-Nitride (III-N) devices with reduced contact resistance and their methods of fabrication.

In first examples, a device includes a terminal structure having a first group III-Nitride (III-N) material, where the terminal structure has a central body and a first plurality of fins, and a second plurality of fins, opposite the first plurality of fins, a polarization charge inducing layer above a first portion of the central body, where the polarization charge inducing layer includes a second III-N material, a gate electrode above the polarization charge inducing layer, a source structure and a drain structure including a third III-N material with an impurity dopant on opposite sides of the gate electrode, the source structure above a second portion of the central body and above the first plurality of fins, the drain structure above a third portion of the central body and above the second plurality of fins, a source contact on the source structure and a drain contact on the drain structure.

In second examples, for any of first examples, the bottom electrode, each fin in the first or the second plurality of fins has a width between 100 nm-500 nm and a length between 0.5 micrometer and 1 micrometer.

In third examples, for any of the first through second examples, a spacing between each successive fin in the first or the second plurality of fins is less than the width of the fin.

In fourth examples, for any of the first through third examples, the number of fins in the first and the second plurality of fins is between 2-1000.

In fifth examples, for any of the first through fourth examples, the source contact has an area of contact over the first plurality of fins, wherein the area of contact has a first dimension that is greater than a combined width of the first plurality of fins summed with the combined width of the spacing between the first plurality of fins, and wherein the source contact has a second dimension that is approximately equal to a length of the fins.

In sixth examples, for any of the first through fifth examples, the drain contact has an area of contact on the drain structure, wherein the area of contact has a first dimension that is greater than a combined width of the second plurality of fins and the combined width of the spacing between the second plurality of fins and, wherein the drain contact has a second dimension that is approximately equal to the length of the second plurality of fins In seventh examples, for any of the first through sixth examples, the source structure and a drain structure include of faceted crystals having sidewalls that are approximately 60 degrees with respect to an uppermost surface of the first or the second plurality of fins.

In eighth examples, for any of the first through seventh examples, the sidewalls intersect to form an apex.

In ninth examples, for any of the first through eighth examples, the source structure and a drain structure each have an uppermost surface that is corrugated and wherein the corrugation is between 10 nm-50 nm.

In tenth examples, for any of the first through ninth examples, the first III-N material includes a gallium nitride (GaN) and the second III-N material includes a III-N material that includes aluminum.

In eleventh examples, for any of the first through tenth examples, the source structure and the drain structure each includes a III-N material having an indium content that increases from 1% to 10%.

In twelfth examples, for any of the first through eleventh examples, the source structure and the drain structure each include a material that is lattice matched to the first III-N material and an n-type impurity dopant.

In thirteenth examples, for any of the first through twelfth examples, the device further includes a gate dielectric layer between the gate electrode and the polarization charge inducing layer.

In fourteenth examples, for any of the first through thirteenth examples, the gate electrode comprises a work function layer and a gate metal cap.

In fifteenth examples, a method of fabricating a semiconductor structure includes forming a layer having a first group III-nitride (III-N) material on a substrate. The method further includes forming a polarization charge inducing layer including a second III-N material above the first layer and patterning the layer including the first III-N material and the polarization charge inducing layer and forming a central body, a first plurality of fins adjacent to a first side of the central body, and a second plurality of fins adjacent to a second side of the central body, opposite the first side. The method further includes forming an isolation between the first plurality of fins and between the second plurality of fins. The method further includes forming a first trench and a second trench, laterally separated from the first trench, in the first III-N semiconductor material. The method further includes forming a source structure in the first trench and a drain structure in the second trench and forming a gate dielectric layer on the polarization charge inducing layer. The method further includes forming a gate electrode on the gate dielectric layer and forming a source contact on the source structure and a drain contact on the drain structure.

In sixteenth examples, for any of the fifteenth examples, the method of forming the isolation includes depositing an electrically insulating layer on the patterned polarization charge inducing layer, between the first and the second plurality of fins and on the layer comprising the first III-N material between the first and the second plurality of fins, and planarizing the electrically insulating layer and removing it from an uppermost surface of the polarization charge inducing layer.

In seventeenth examples, for any of the fifteenth through sixteenth examples, the method of forming the first recess and a second recess includes removing polarization charge inducing layer from above the first and the second plurality of fins and from a portion of the central body.

In eighteenth examples, for any of the fifteenth through seventeenth examples, the method of forming the source structure includes growing a third III-N material in the first recess and on the first III-N material, and forming the drain structure includes growing the third III-N material in the second recess and on the first III-N material, wherein the growing includes forming crystal structures with slanted sidewalls.

In nineteenth examples, for any of the fifteenth through eighteenth examples, the growing includes a merging of slanted sidewalls to form an apex. In twentieth examples, a system includes a processor and a radio transceiver coupled to the processor, wherein the transceiver includes a group III-Nitride (III-N) transistor. The III-N transistor includes a terminal structure having a first group III-Nitride (III-N) material, where the terminal structure has a central body and a first plurality of fins, and a second plurality of fins, opposite the first plurality of fins, a polarization charge inducing layer above a first portion of the central body, where the polarization charge inducing layer includes a second III-N material, a gate electrode above the polarization charge inducing layer, a source structure and a drain structure including a third III-N material with an impurity dopant on opposite sides of the gate electrode, the source structure above a second portion of the central body and above the first plurality of fins, the drain structure above a third portion of the central body and above the second plurality of fins, a source contact on the source structure and a drain contact on the drain structure.

In twenty first examples, for any of the twentieth examples, each fin in the first or the second plurality of fins has a width between 100 nm-500 nm and a length between 0.5 micrometer and 1 micrometer.

In twenty second examples, for any of the twentieth examples, a spacing between each successive fin in the first or the second plurality of fins is less than the width of the fin.

In twenty third examples, for any of the twentieth through twenty second examples, the source contact has an area of contact on the first plurality of fins, wherein the area of contact has a first dimension that is greater than a combined width of the first plurality of fins summed with the combined width of the spacing between the first plurality of fins, and wherein the source contact has a second dimension that is approximately equal to a length of the fins.

In twenty fourth examples, for any of the twentieth through twenty third examples, the source structure and a drain structure include of faceted crystals having sidewalls that are approximately 60 degrees with respect to an uppermost surface of the first or the second plurality of fins.

In twenty fifth examples, for any of the twentieth through twenty fourth examples, the source structure and a drain structure each have an uppermost surface that is corrugated and wherein the corrugation is between 10 nm-50 nm.

What is claimed is:

1. A device comprising:
a first plurality of fins comprising a first group III-Nitride (III-N) material layer, wherein the first plurality of fins are spaced apart over a length in a first dimension;
a second plurality of fins comprising the first group III-N material layer, wherein the second plurality of fins are spaced apart along the length in the first dimension;
a central body comprising the first group III-N material layer, wherein the central body spans at least the length in the first dimension, the first plurality of fins intersect the central body on a first side, and the second plurality of fins intersect the central body on a second side, opposite the first side, and wherein the first group III-N material layer is continuous between the central body and each of the first and second pluralities of fins;

a polarization charge inducing layer above at least a portion of the central body, the polarization charge inducing layer comprising a second group III-N material of a composition that induces a 2-dimensional electron gas (2DEG) within a region of the first group III-N material layer of the central body;

a gate electrode above at least a portion of the central body;

a source structure and a drain structure comprising a third group III-N material with an impurity dopant, wherein the source structure is above, and electrically coupled to, the first plurality of fins, and wherein the drain structure is above, and electrically coupled to, the second plurality of fins;

a source contact in contact with the source structure; and a drain contact in contact with the drain structure.

2. The device of claim 1, wherein each fin in the first or the second plurality of fins has a width in the first dimension between 100 nm-500 nm and a length in a second, orthogonal dimension, between 0.5 micrometer and 1 micrometer.

3. The device of claim 2, wherein the first or second plurality of fins comprises 2-1000 fins.

4. The device of claim 1, wherein a spacing between adjacent fins in the first or the second plurality of fins is less than a width of individual ones of the adjacent fins.

5. The device of claim 1, wherein the source contact has an area of contact over the first plurality of fins, wherein the area of contact has a first dimension that is greater than a combined width of the first plurality of fins summed with a combined width of a spacing between the first plurality of fins, and wherein the source contact has a second dimension that is approximately equal to a length of the first plurality of fins.

6. The device of claim 5, wherein the drain contact has an area of contact on the drain structure, wherein the area of contact has a first dimension that is greater than a combined width of the second plurality of fins and a combined width of a spacing between the second plurality of fins and, wherein the drain contact has a second dimension that is approximately equal to the length of the second plurality of fins.

7. The device of claim 1, wherein the source structure and the drain structure comprise a faceted crystal having a sidewall that is sloped at approximately 60 degrees from an uppermost surface of the first or second plurality of fins.

8. The device of claim 7, wherein the faceted crystal has an apex where multiple sidewall facets intersect.

9. The device of claim 1, wherein the source structure and the drain structure comprise a material that is epitaxial to the first group III-N material, and an n-type impurity dopant.

10. The device of claim 1, wherein the source structure and the drain structure comprise a corrugated uppermost surface with a corrugation between 10 nm-50nm.

11. The device of claim 10, wherein the source structure and the drain structure comprise a group III-N material having an indium content that increases from 1% to 10%.

12. The device of claim 1, wherein the first group III-N material layer is binary gallium nitride (GaN) and the second group III-N material comprises aluminum.

13. The device of claim 1, further comprising a gate dielectric layer between the gate electrode and the central body.

14. The device of claim 1, wherein the gate electrode comprises a work function layer and a gate metal cap.

15. The device of claim 1, wherein the polarization charge inducing layer is in direct contact with the central body.

16. A system comprising:

a processor; and a radio transceiver coupled to the processor, wherein the transceiver includes a group III-Nitride (III-N) transistor comprising:

a structure having a central body extending a length in a first direction and consisting of a first portion of a first group III-Nitride (III-N) material layer, a first plurality of fins extending in a second direction and substantially coplanar with the central body, the first plurality of fins intersecting a first side of the central body and comprising a second portion of the first group III-N material layer extending from, but continuous with, the central body, and a second plurality of fins extending in the second direction and substantially coplanar with the central body, the second plurality of fins intersecting a second side of the central body, opposite the first side, and comprising a third portion of the first group III-N material layer extending from, but continuous with, the central body;

a polarization charge inducing layer above at least a portion of the central body, the polarization charge inducing layer comprising a second group III-N material of a composition that induces a 2-dimensional electron gas (2DEG) within a channel region of the first group III-N material layer;

a gate electrode above at least a portion of the central body;

a source structure and a drain structure comprising a third group III-N material with an impurity dopant, the source structure above, and electrically coupled to, the first plurality of fins, the drain structure above, and electrically coupled to, the second plurality of fins;

a source contact in contact with the source structure; and a drain contact in contact with the drain structure.

17. The system of claim 16, where a spacing between adjacent fins of the first or the second plurality of fins is less than a width of individual ones of the adjacent fins.

18. The system of claim 16, wherein the polarization charge inducing layer is in direct contact with the first plurality of fins and the second plurality of fins.

19. A transistor structure, comprising:

a central body comprising a first group III-Nitride (III-N) material and extending a length in a first direction;

a first plurality of fins comprising the first group III-N material, wherein the first plurality of fins are substantially parallel to each other and extend a length in a second direction, non-parallel to the first direction, wherein the first plurality of fins intersect a first side of the central body, and wherein the first group III-N material is continuous between the central body and the first plurality of fins;

a second plurality of fins comprising the first group III-N material, wherein the second plurality of fins are substantially parallel to each other and extend a length in the second direction, wherein the second plurality of fins intersect a second side of the central body, opposite the first side and wherein the first group III-N material is continuous between the central body and the second plurality of fins;

a gate electrode above at least a portion of the central body;

a source structure and a drain structure comprising a second group III-N material with an impurity dopant, wherein the source structure is above, and electrically coupled to, the first plurality of fins, and wherein the drain structure is above, and electrically coupled to, the second plurality of fins;
a source contact in contact with the source structure; and
a drain contact in contact with the drain structure.

20. The transistor structure of claim 19, where a spacing between adjacent fins of the first or the second plurality of fins is less than a width of individual ones of the adjacent fins.

* * * * *